US012588429B2

(12) United States Patent
Sung et al.

(10) Patent No.: US 12,588,429 B2
(45) Date of Patent: Mar. 24, 2026

(54) RESISTIVE MEMORY DEVICE INCLUDING A SILICON OXIDE BASE SPACER AND METHODS FOR FORMING THE SAME

(71) Applicant: Taiwan Semiconductor Manufacturing Company Limited, Hsinchu (TW)

(72) Inventors: Fu-Ting Sung, Yangmei City (TW); Jhih-Bin Chen, Hsinchu (TW); Hung-Shu Huang, Taichung City (TW); Hong Ming Liu, Hsinchu City (TW); Hsia-Wei Chen, Taipei City (TW); Yu-Wen Liao, New Taipei City (TW); Wen-Ting Chu, Kaohsiung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 370 days.

(21) Appl. No.: 18/303,682

(22) Filed: Apr. 20, 2023

(65) Prior Publication Data

US 2024/0114810 A1     Apr. 4, 2024

Related U.S. Application Data

(60) Provisional application No. 63/411,704, filed on Sep. 30, 2022.

(51) Int. Cl.
| | |
|---|---|
| *H01L 23/52* | (2006.01) |
| *H01L 23/522* | (2006.01) |
| *H01L 23/528* | (2006.01) |
| *H10B 63/00* | (2023.01) |
| *H10N 70/00* | (2023.01) |
| *H10N 70/20* | (2023.01) |

(52) U.S. Cl.
CPC ....... *H10N 70/841* (2023.02); *H01L 23/5226* (2013.01); *H01L 23/5283* (2013.01); *H10B 63/34* (2023.02); *H10N 70/063* (2023.02); *H10N 70/253* (2023.02); *H10N 70/826* (2023.02)

(58) Field of Classification Search
CPC .... H10N 70/481; H10N 70/826; H10D 63/34; H10D 70/253; H10D 70/063; H01L 23/5226; H10L 23/5283
USPC ........................................................... 257/4
See application file for complete search history.

(56) References Cited

U.S. PATENT DOCUMENTS

2015/0144859 A1*   5/2015   Chen .................... H10N 70/066
                                                         257/4
2017/0117467 A1*   4/2017   Chang .................. H10N 70/066

FOREIGN PATENT DOCUMENTS

CN           107887393 B   *   4/2018   ............. H10N 50/85

* cited by examiner

*Primary Examiner* — Phuc T Dang
(74) *Attorney, Agent, or Firm* — The Marbury Law Group, PLLC

(57)     ABSTRACT

A semiconductor structure includes: an etch-stop dielectric layer overlying a substrate and including a first opening therethrough; a silicon oxide plate overlying the etch-stop dielectric layer and including a second opening therethrough; a first conductive structure including a first electrode and extending through the second opening and the first opening; a memory film contacting a top surface of the first conductive structure and including a material that provides at least two resistive states having different electrical resistivity; and a second conductive structure including a second electrode and contacting a top surface of the memory film.

20 Claims, 22 Drawing Sheets

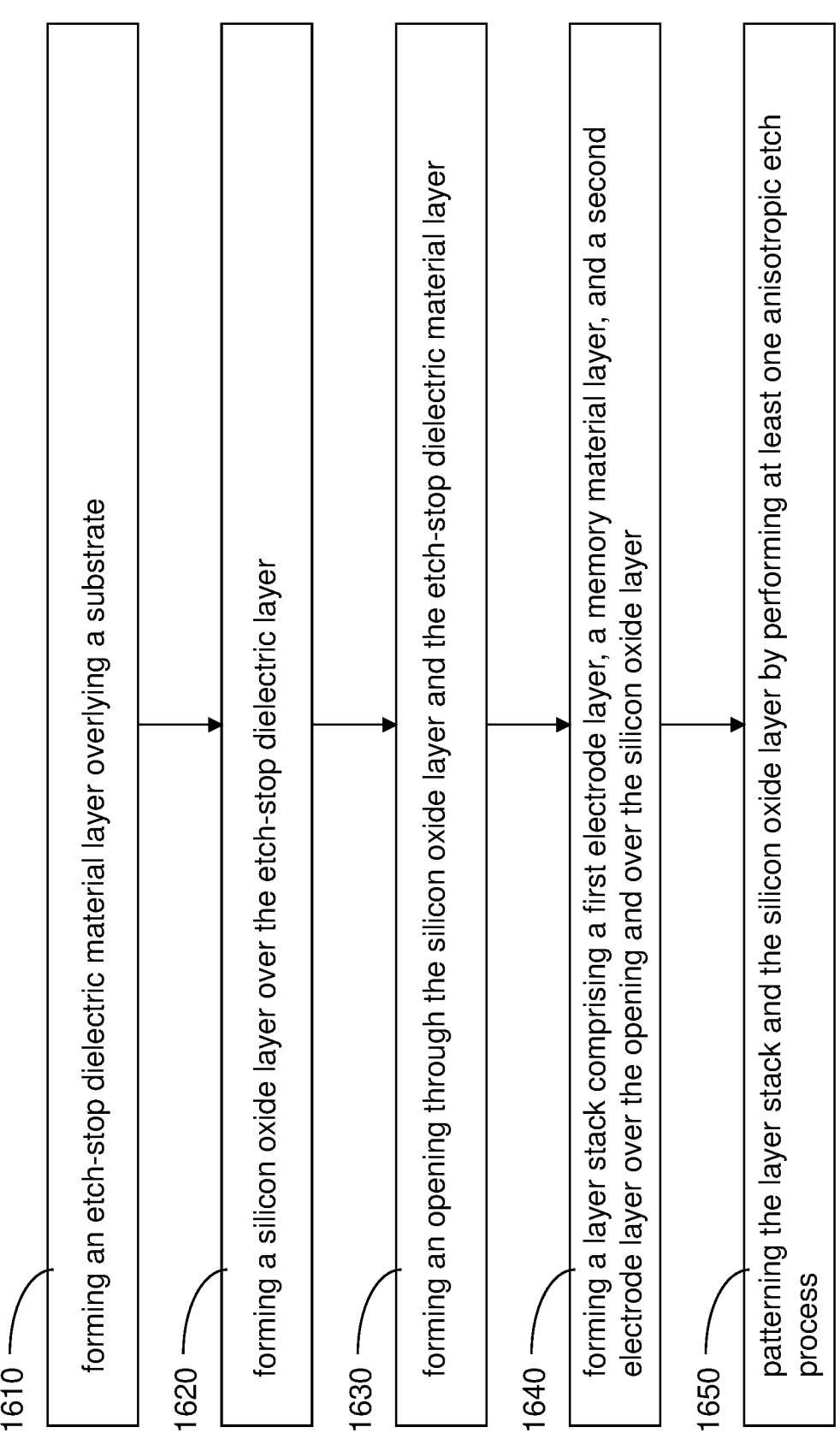

1610 — forming an etch-stop dielectric material layer overlying a substrate

1620 — forming a silicon oxide layer over the etch-stop dielectric layer

1630 — forming an opening through the silicon oxide layer and the etch-stop dielectric material layer 1640 — forming a layer stack comprising a first electrode layer, a memory material layer, and a second electrode layer over the opening and over the silicon oxide layer 1650 — patterning the layer stack and the silicon oxide layer by performing at least one anisotropic etch process

FIG. 16

RESISTIVE MEMORY DEVICE INCLUDING A SILICON OXIDE BASE SPACER AND METHODS FOR FORMING THE SAME

RELATED APPLICATIONS

This application claims priority from U.S. Provisional Application Ser. No. 63/411,704 entitled "Resistive Memory Device Including a Silicon Oxide Base Spacer And Methods For Forming The Same," filed on Sep. 30, 2022, the entire contents of which are incorporated herein by reference for all purposes.

BACKGROUND

A resistive memory device is a memory device in which the memory element comprises a resistive material that may be programmed into at least two different resistive states. The change in the resistivity of the resistive material may be caused by formation or removal of conductive filaments in a filament forming dielectric material or by a change in the crystalline phase of the resistive material that results in a change in the electrical resistivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a flowchart that illustrates the general processing steps for manufacturing the semiconductor device of the present disclosure.

DETAILED DESCRIPTION

Figure 1:
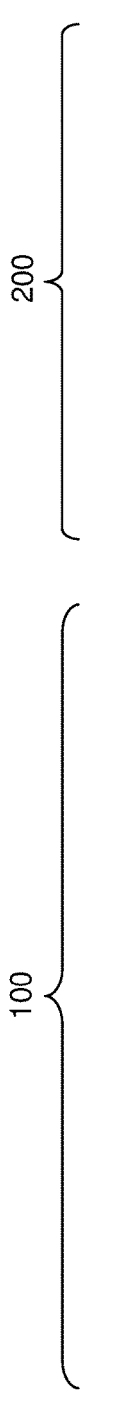
FIG. 1 is a vertical cross-sectional view of an exemplary structure after formation of complementary metal-oxide-semiconductor (CMOS) transistors, lower-level metal interconnect structures formed in lower-level dielectric material layers, and a lower via-level dielectric layer according to an embodiment of the present disclosure.
Figure 1:
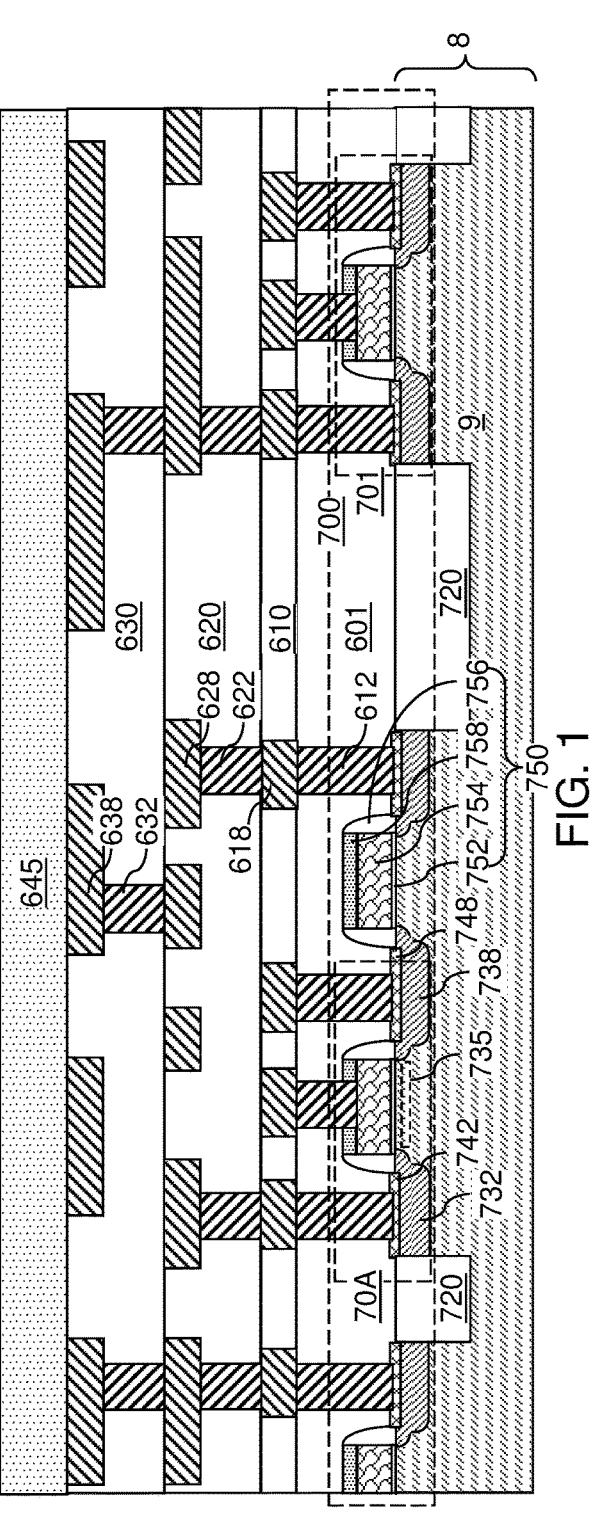

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A resistive memory cell includes a resistive memory material that changes resistivity depending on programming conditions. Resistive memory cells are likely to be scaled into nanometer dimensions due to excellent resistivity and reliability characteristics even at nanometer dimensions. Incorporation of resistive memory cells into interconnect-levels in a back-end structure generates variations in the topography of a top surface of a dielectric material layer that is formed over the resistive memory cells. Thus, it is advantageous to reduce the height of resistive memory cells in order to facilitate incorporation of the resistive memory cells into a back-end structure.

According to an aspect of the present disclosure, silicon oxide plates may be used as insulating structures between each bottom conductive structure of resistive memory cells and an underlying etch-stop dielectric layer. For example, a silicon oxide plate layer having a first thickness may be deposited over the etch-stop dielectric layer, and an array of openings may be formed through the silicon oxide plate layer and the etch-stop dielectric layer. The silicon oxide plate layer may be thinned to a second thickness, which may be in a range from 10% to 60% of the first thickness. A material layer stack may be deposited and patterned to form an array of memory cells, and the silicon oxide layer may be patterned into an array of silicon oxide plates. The thinning of each silicon oxide plate layer reduces the total stack height of the silicon oxide plates and the memory cells. The reduction in the thickness of dielectric plates (such as the silicon oxide plates) underneath the memory openings enhances the uniformity of bottom electrodes, and increases the device yield of the resistive memory cells. Further, an upper via-level dielectric material layer may be formed void-free and reduced topography in the top surface, and a planarization process may be eliminated to reduce the processing cost and the turn-around time. Thus, integration of an array of resistive memory cells into a back-end structure becomes easier and scaling of the array of resistive memory cells may be facilitated. The various aspects of the present disclosure are now described in detail with reference to accompanying drawings.

Referring to FIG. 1, an exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors (70A, 701) may be formed over the top surface of the semiconductor material layer 9. The field effect transistors (70A, 701) may comprise an array of access transistors 70A that are used to individually access each memory cell within a two-dimensional array of memory cells to be subsequently formed. Further, the field effect transistors (70A, 701) may comprise peripheral field effect transistors 701 within a peripheral circuit. For example, the peripheral field effect transistors 701 may comprise bit line drivers configured to apply a bit line bias voltage to bit lines to be subsequently formed, and sense amplifiers configured to detect electrical current that flows through the bit lines during a read operation.

For example, each field effect transistor (70A, 701) may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The exemplary structure may include a memory array region 100 in which an array of memory cells may be subsequently formed. The exemplary structure may further include a peripheral region 200 in which metal wiring for the array of memory devices is provided. Generally, the access transistors 70A in the CMOS circuitry 700 may be electrically connected to an electrode of a respective memory cell to be subsequently formed by a respective set of metal interconnect structures.

Devices (such as peripheral field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors (70A, 701) in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor (70A, 701) in the CMOS circuitry 700 may include a single crystalline semiconductor channel such as a single crystalline silicon channel. In one embodiment, a plurality of access transistors 70A in the CMOS circuitry 700 may include a respective node that is subsequently electrically connected to a node of a respective memory cell to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

Various metal interconnect structures formed within dielectric material layers may be subsequently formed over the substrate 8 and the semiconductor devices thereupon (such as field effect transistors (70A, 701)). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, and third metal line structures 638 formed in an upper portion of the third interconnect-level dielectric material layer 630.

Each of the dielectric material layers (601, 610, 620, 630) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Likewise, the second metal via structures 632 and the third metal line structures 638 may be formed as integrated line and via structures by a dual damascene process. The dielectric material layers (601, 610, 620, 630) are herein referred to as lower-lower-level dielectric material layers. The metal interconnect structures (612, 618, 622, 628, 632, 638) formed within in the lower-level dielectric material layers are herein referred to as lower-level metal interconnect structures.

6

Generally, a two-dimensional array of access transistors 70A may be formed on the substrate 8. Each access transistor 70A within the two-dimensional array of access transistors 70A may be configured to be electrically connected to a respective memory cell within a two-dimensional array of memory cells to be subsequently formed. The electrical connection may be provided by the metal interconnect structures (612, 618, 622, 628, 632, 638) located within the dielectric material layers (601, 610, 620, 630, 645).

While the present disclosure is described using an embodiment in which an array of memory cells may be formed over the third line-and-via-level dielectric material layer 630, embodiments are expressly contemplated herein in which the array of memory cells may be formed at a different metal interconnect level.

In one embodiment, a planar dielectric material layer having a uniform thickness may be formed over the lower-level dielectric material layers (601, 610, 620, 630). The planar dielectric material layer is herein referred to as a lower via-level dielectric layer 645. The lower via-level dielectric layer 645 includes a dielectric material. In one embodiment, the lower via-level dielectric layer 645 may comprise an extremely low-k (ELK) dielectric material. In one embodiment, the lower via-level dielectric layer 645 comprises, and/or consists essentially of, at least one dielectric material selected from undoped silicate glass, a doped silicate glass, organosilicate glass, a porous dielectric material, silicon nitride, silicon oxynitride, silicon carbide, silicon oxycarbide, and silicon carbonitride. The lower via-level dielectric layer 645 may be deposited, for example, by chemical vapor deposition. The thickness of the lower via-level dielectric layer 645 may be in a range from 20 nm to 300 nm, although lesser and greater thicknesses may also be used.

Generally, metal interconnect structures (herein referred to as lower-level metal interconnect structures (612, 618, 622, 628, 632, 638)) embedded within interconnect-level dielectric layers (such as the lower-level dielectric material layer (601, 610, 620, 630)) may be formed over semiconductor devices. The lower via-level dielectric layer 645 may be formed over the interconnect-level dielectric layers.

Figure 2A:
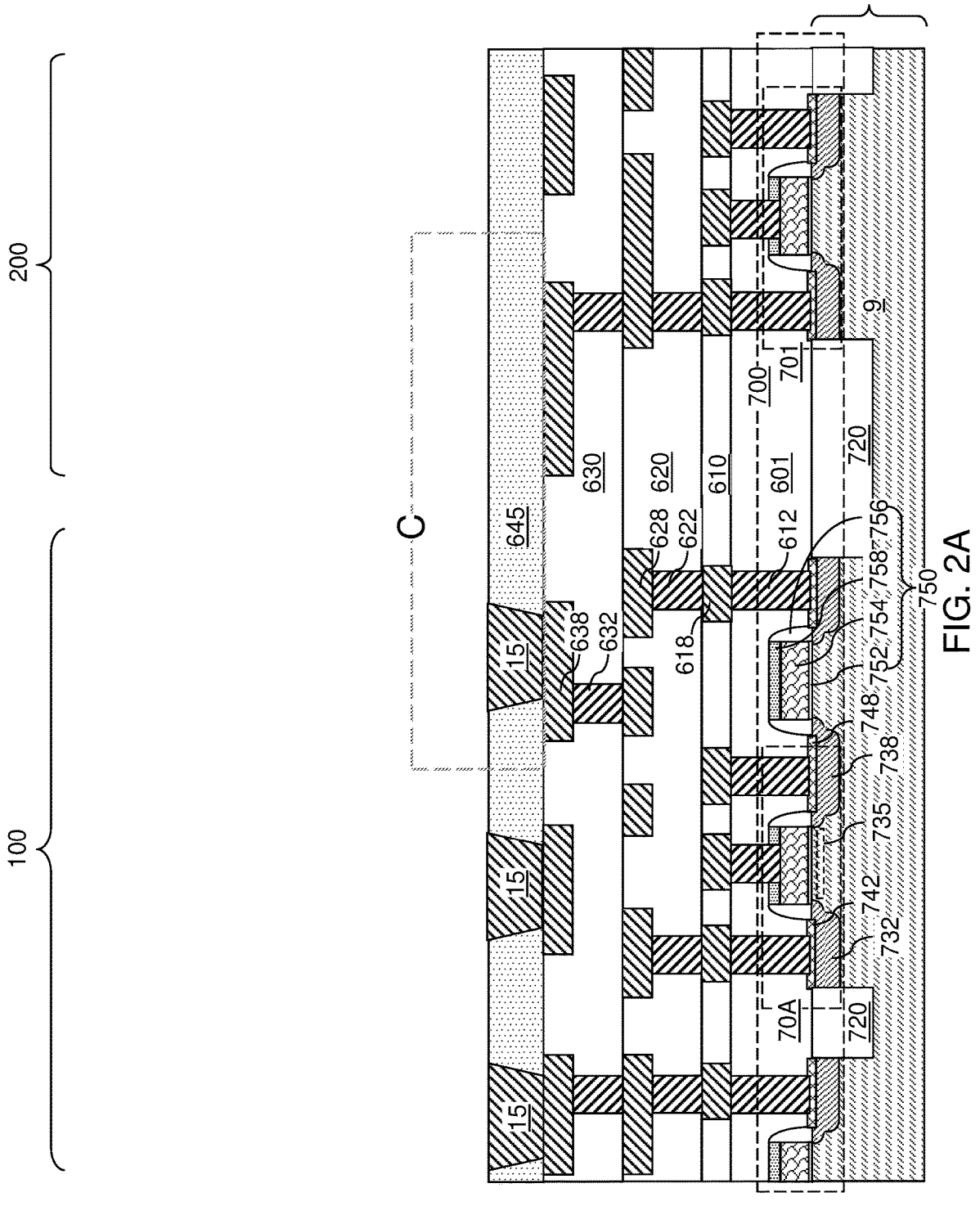
FIG. 2A is a vertical cross-sectional view of the exemplary structure after formation of bottom connection via structures according to an embodiment of the present disclosure.
Figure 2B:
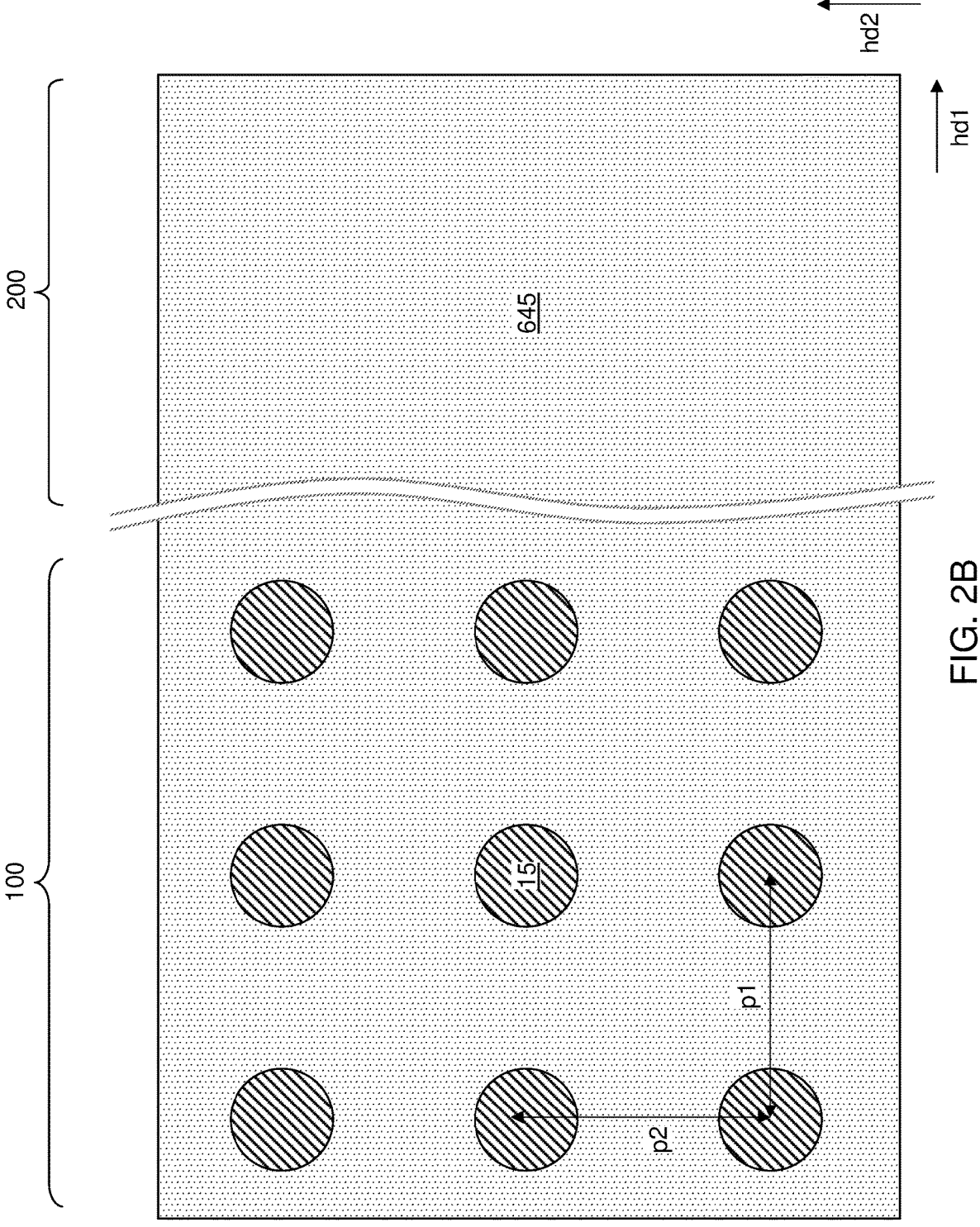
FIG. 2B is a top-down view of the exemplary structure of FIG. 2A.
Figure 2C:
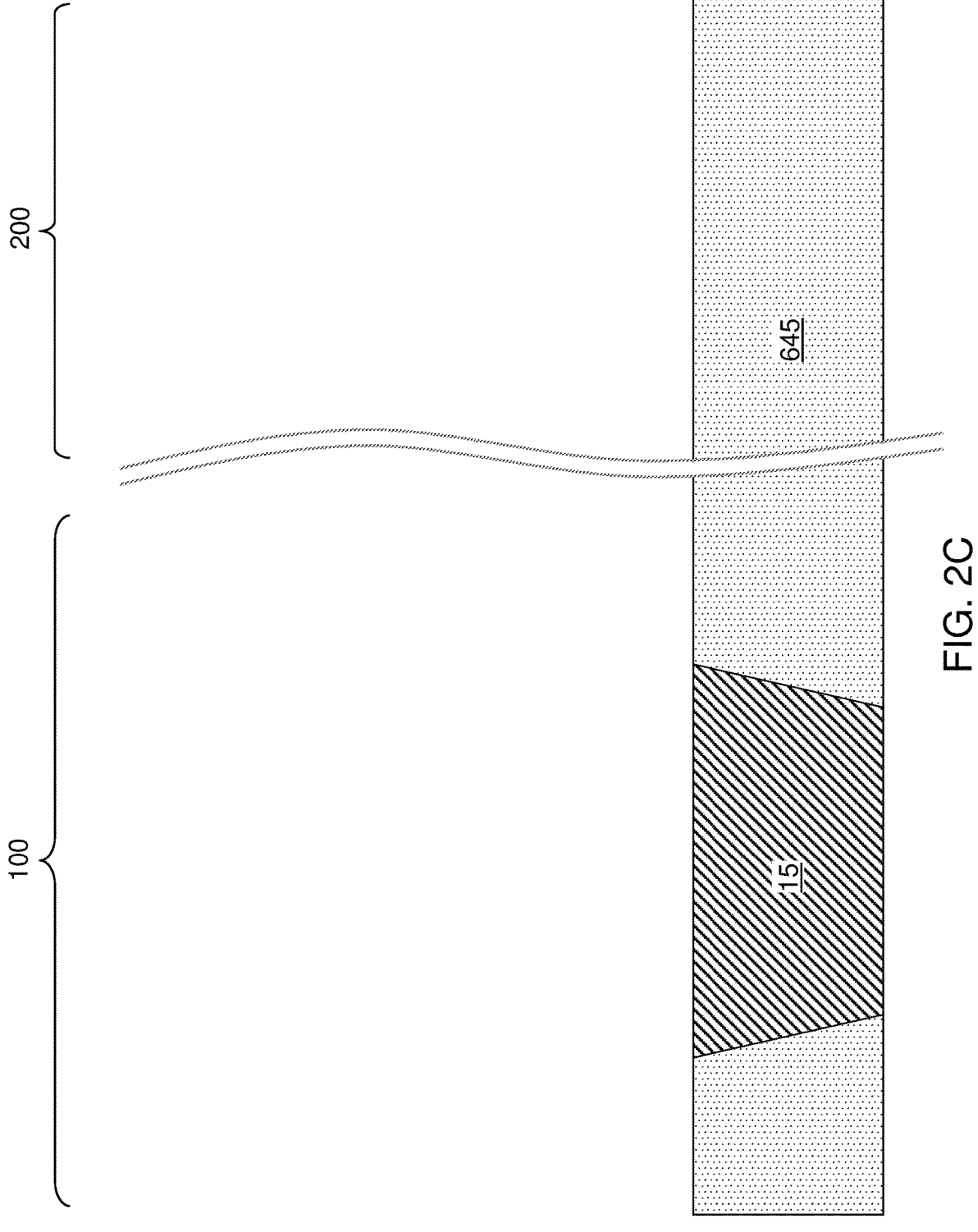
FIG. 2C is a magnified view of region C in FIG. 2A.

Referring to FIGS. 2A-2C, a photoresist layer (not shown) may be applied over the lower via-level dielectric layer 645, and may be lithographically patterned to form a two-dimensional array of openings. The two-dimensional array of openings may have a first pitch along a first horizontal direction hd1, and may have a second pitch along a second horizontal direction hd2. Each of the openings in the photoresist layer may have a horizontal cross-sectional shape of a circle, a rectangle, a rounded rectangle, or any other two-dimensional curvilinear shape having a closed periphery. An anisotropic etch process may be performed to transfer the pattern of the openings in the photoresist layer through the lower via-level dielectric layer 645. A top surface of a respective lower-level metal interconnect structure (such as a top surface of a respective third metal line structure 638 in the illustrated example) may be physically exposed at the bottom of each opening through the lower via-level dielectric layer 645. The photoresist layer may be subsequently removed, for example, by ashing.

The two-dimensional array of openings may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the lower via-level dielectric layer 645.

Each remaining portion of the at least one metallic material comprises a bottom connection via structure 15. A two-dimensional array of bottom connection via structures 15 may be formed within the lower via-level dielectric layer 645. Generally, the horizontal cross-sectional shape of each bottom connection via structure 15 may be any two-dimensional shape having a closed periphery. For example, the horizontal cross-sectional shapes of the bottom connection via structures 15 may be shapes of a circle, ellipse, a rectangle, a rounded rectangle, or any two-dimensional curvilinear shape having a closed periphery. Other shapes are within the contemplated scope of disclosure. The top surfaces of the bottom connection via structures 15 may be coplanar with the top surface of the lower via-level dielectric layer 645. The periodicity of the bottom connection via structures 15 along the first horizontal direction hd1 may be the first pitch p1. The periodicity of the bottom connection via structures 15 along the second horizontal direction hd2 is herein referred to as a second pitch p2.

Generally, the bottom connection via structures 15 comprise a metallic material, and may be formed as a two-dimensional periodic array of via structures. In one embodiment, the bottom connection via structures 15 may be formed in a topmost dielectric material layer (such as the lower via-level dielectric layer 645) selected from the dielectric material layers (601, 610, 620, 630, 645).

Figure 3:
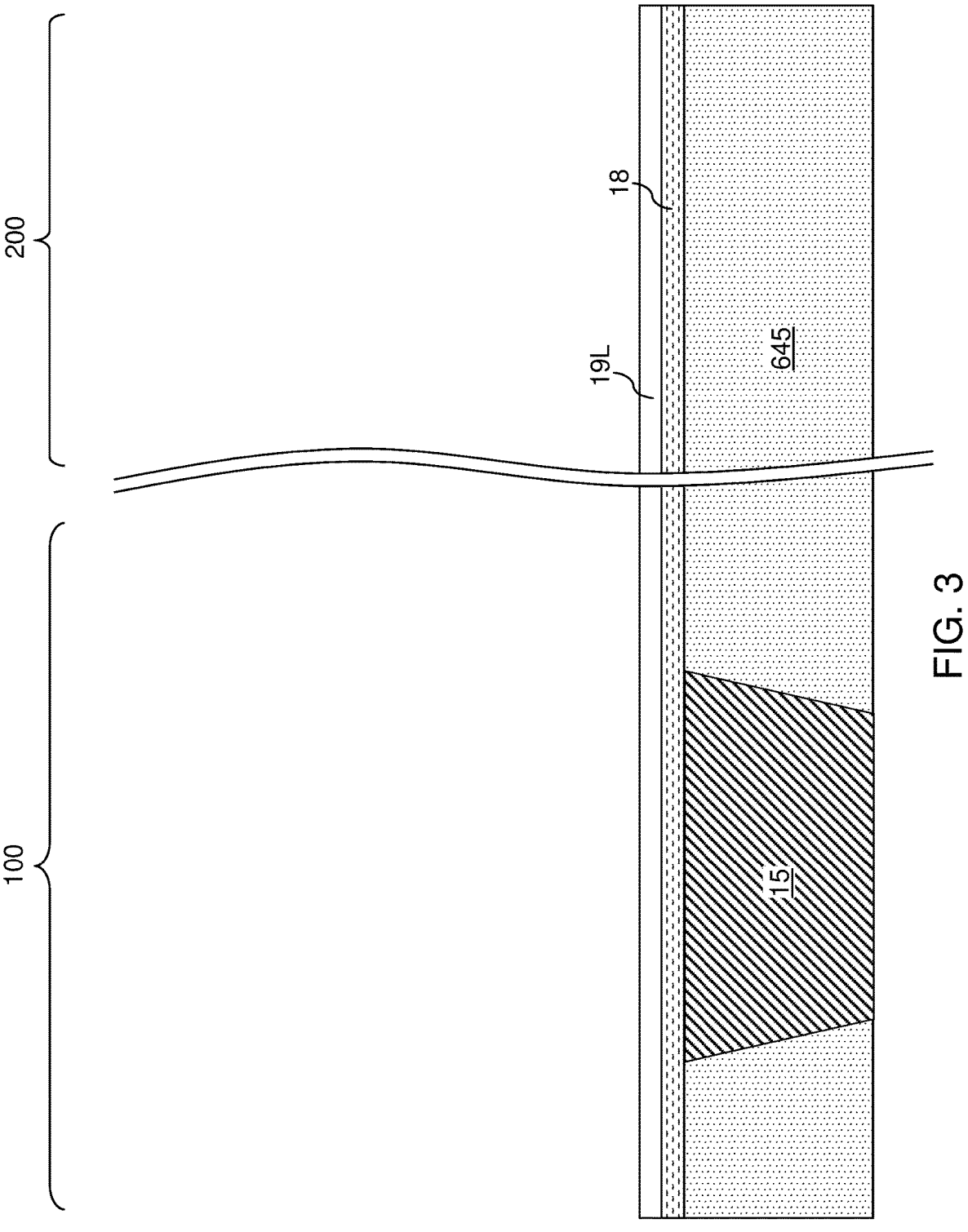
FIG. 3 is a vertical cross-sectional view of a region of the exemplary structure after formation of an etch-stop dielectric layer and a silicon oxide layer according to an embodiment of the present disclosure.

Referring to FIG. 3, an etch-stop dielectric layer 18 may be formed over the lower via-level dielectric layer 645. The etch-stop dielectric layer 18 may comprise a dielectric material that may be used as an etch stop structure for an anisotropic etch process to be subsequently used to pattern memory cells. In one embodiment, the etch-stop dielectric layer 18 comprises, and/or consists essentially of, a material such as silicon carbide, silicon nitride, or silicon carbide nitride. In one embodiment, the etch-stop dielectric layer 18 comprises, and/or consists essentially of, silicon carbide. The thickness of the etch-stop dielectric layer 18 may be in a range from 3 nm to 30 nm, such as from 6 nm to 20 nm, although lesser and greater thicknesses may also be used. The etch-stop dielectric layer 18 may be formed, for example, by chemical vapor deposition. Generally, the etch-stop dielectric layer 18 over metal interconnect structures (612, 618, 622, 628, 632, 638, 15).

According to an aspect of the present disclosure, a silicon oxide plate layer 19L (also referred simply as silicon oxide layer 19L) may be deposited over the etch-stop dielectric layer 18. The silicon oxide layer 19L may be formed by a plasma-enhanced chemical vapor deposition (PECVD) process using tetraethyl orthosilicate (TEOS) as a precursor gas. In this embodiment, the silicon oxide layer 19L may comprise a silicon oxide material including decomposition products of TEOS. In one embodiment, the silicon oxide layer 19L may contain carbon atoms at an atomic concentration of at least 100 parts per million, and hydrogen atoms at an atomic concentration of at least 100 parts per million. The thickness of the silicon oxide layer 19L may be in a range from 10 nm to 30 nm, although lesser and greater thicknesses may also be used.

Figure 4A:
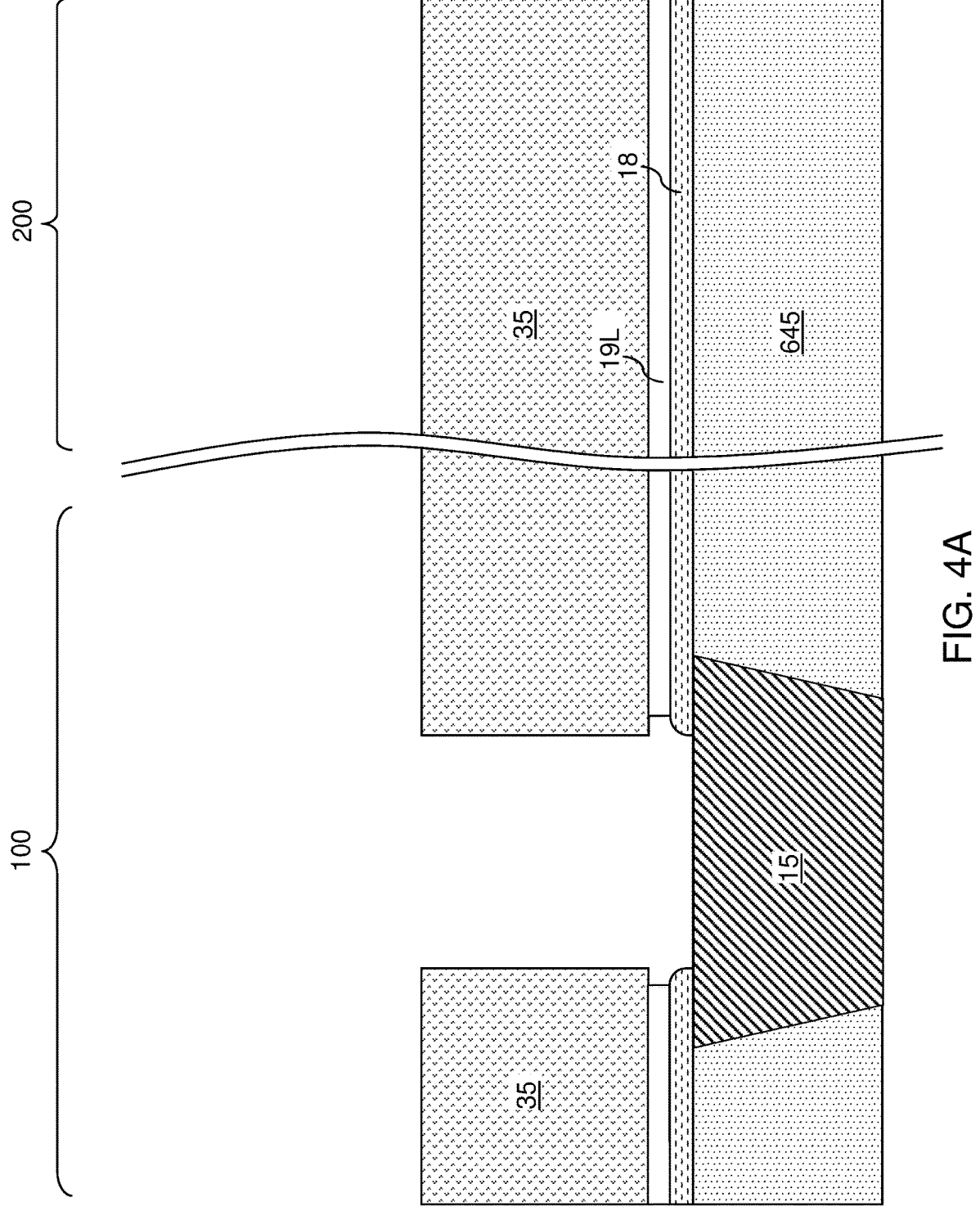
FIG. 4A is a vertical cross-sectional view of a region of a first configuration of the exemplary structure after forming openings through the silicon oxide layer and the etch-stop dielectric layer according to an embodiment of the present disclosure.

Referring to FIG. 4A, a photoresist layer 35 may be formed over the silicon oxide layer 19L, and may be lithographically patterned to form a two-dimensional array of openings within the memory array region 100. Each opening may be formed within the area of a respective one of the bottom connection via structures 15. The two-dimensional array of openings in the photoresist layer 35 may have the same two-dimensional periodicity as the periodicity of the two-dimensional array of bottom connection via structures 15.

At least one etch process may be performed to transfer the pattern of the opening in the photoresist layer 35 through the silicon oxide layer 19L and the etch-stop dielectric layer 18. In one embodiment, the at least one etch process may comprise a first anisotropic etch process that etches unmasked portions of the silicon oxide layer 19L and a second anisotropic etch process that etches unmasked portions of the etch-stop dielectric layer 18. According to an aspect of the present disclosure, the at least one etch process comprises an etch step having an isotropic etch chemistry or an isotropic etch component that laterally recesses the material of the silicon oxide layer 19L underneath each opening in the photoresist layer 35. The etch step that laterally recesses the material of the silicon oxide layer 19L may be an additional etch step that may be performed after the first anisotropic etch process and before the second anisotropic etch process, or may be an additional etch stop that is performed after the second anisotropic etch step. In this embodiment, the etch stop may be a wet etch step or a reactive ion etch step. The lateral recess distance of the etch step may be in a range from 20% to 200%, such as from 40% to 150%, of the thickness of the silicon oxide layer 19L. In the first configuration of the exemplary structure illustrated in FIG. 4A, the recessed sidewalls of the silicon oxide layer 19L may be vertical or substantially vertical.

The openings that may be formed through the etch-stop dielectric layer 18 are herein referred to as first openings. The openings that may be formed through the silicon oxide layer 19L are herein referred to as second openings. An array of first openings may be formed through the etch-stop dielectric layer 18, and an array of second openings may be formed through the silicon oxide layer 19L. A top surface of a bottom connection via structure 15 may be physically exposed at the bottom of each first opening through the etch-stop dielectric layer 18. The two-dimensional array of first openings and the two-dimensional array of second openings may have the same periodicity as the array of bottom connection via structures 15.

In one embodiment, a bottom periphery of each second opening through the silicon oxide layer 19L may be laterally offset from a bottom periphery of a respective underlying first opening in the etch-stop dielectric layer 18 by a lateral offset distance. In one embodiment, the lateral offset distance may be in a range from 20% to 200%, such as from 40% to 150%, of the thickness of the silicon oxide layer 19L. In one embodiment, top portions of physically exposed sidewalls of the etch-stop dielectric layer 18 may be chamfered.

Figure 4B:
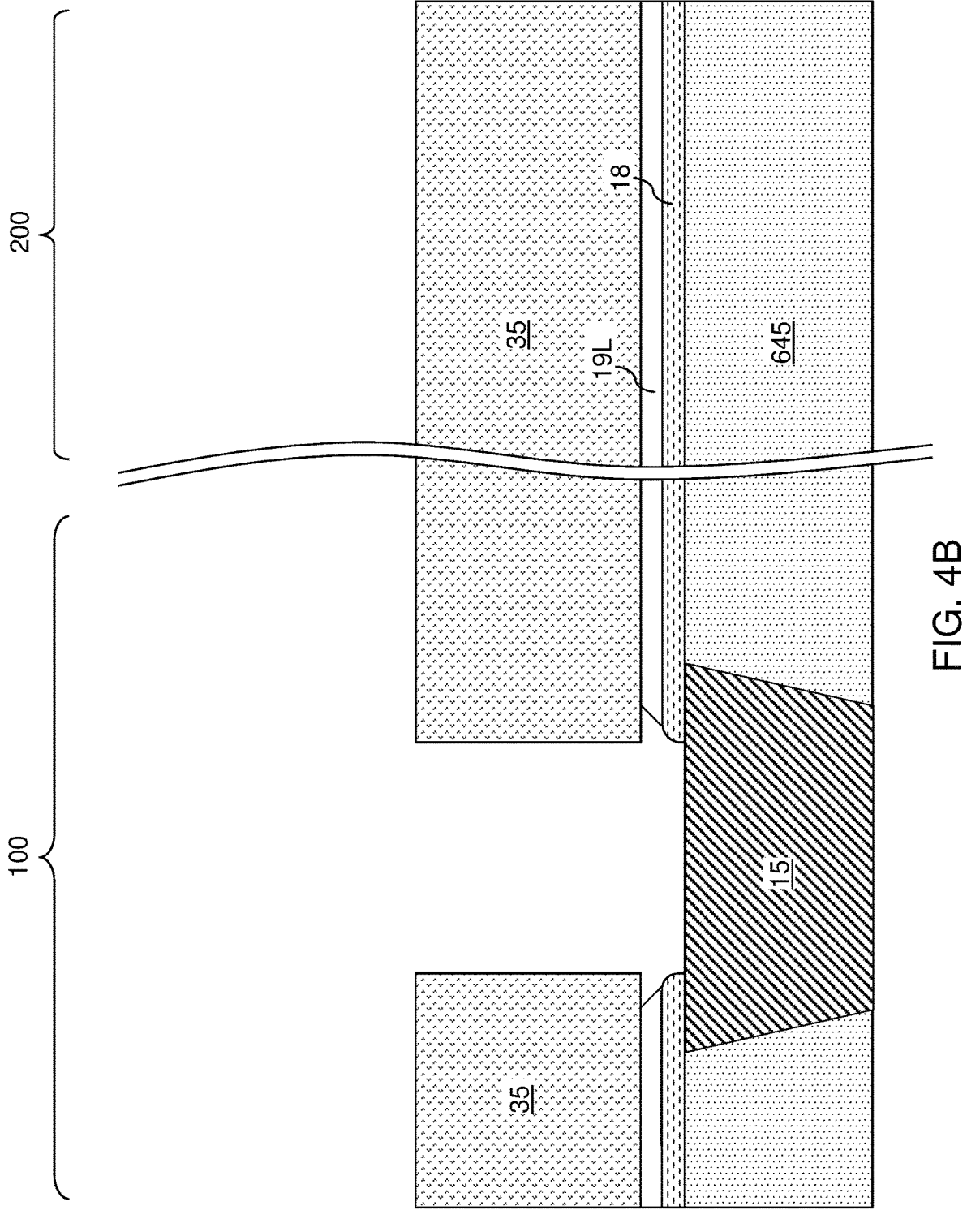
FIG. 4B is a vertical cross-sectional view of a region of a second configuration of the exemplary structure after forming openings through the silicon oxide layer and the etch-stop dielectric layer according to an embodiment of the present disclosure.

Referring to FIG. 4B, a region of a second configuration of the exemplary structure is illustrated after formation of openings through the silicon oxide layer 19L and the etch-stop dielectric layer 18. Generally, at least one etch process may be performed to transfer the pattern of the opening in the photoresist layer 35 through the silicon oxide layer 19L and the etch-stop dielectric layer 18. The at least one etch process comprises an etch step having an isotropic etch chemistry or an isotropic etch component that laterally recesses the material of the silicon oxide layer 19L underneath each opening in the photoresist layer 35. In one embodiment, unmasked portions of the silicon oxide layer 19L may be etched by performing an isotropic etch process such as a wet etch process. In this embodiment, the isotropic etch process may laterally etch the material of the silicon oxide layer 19L underneath each opening in the photoresist layer 35. Subsequently, an anisotropic etch process may be performed to etch unmasked portions of the etch-stop dielectric layer 18 underneath each opening in the photoresist layer 35.

The lateral recess distance of a bottom periphery of each sidewall of the silicon oxide layer 19L from a respective vertical plane including an overlying opening in the photoresist layer 35 may be in a range from 20% to 200%, such as from 40% to 150%, of the thickness of the silicon oxide layer 19L. In the second configuration of the exemplary structure illustrated in FIG. 4B, the recessed sidewalls of the silicon oxide layer 19L may be tapered. In one embodiment, top portions of physically exposed sidewalls of the etch-stop dielectric layer 18 may be chamfered.

Figure 5:
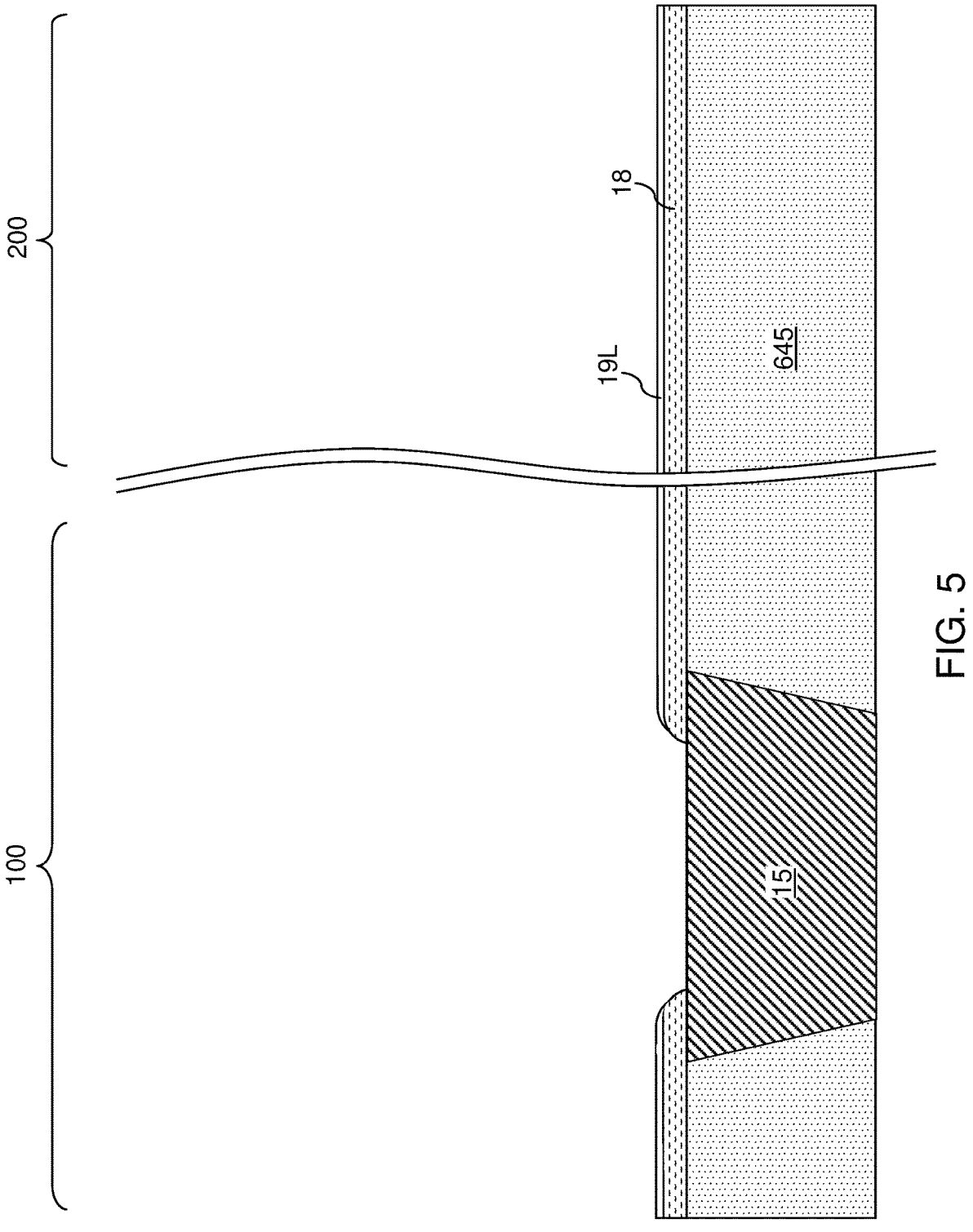
FIG. 5 is a vertical cross-sectional view of a region of the exemplary structure after removal of a patterned photoresist layer and thinning of the silicon oxide layer according to an embodiment of the present disclosure.

Referring to FIG. 5, the photoresist layer 35 may be removed, for example, by ashing. The silicon oxide layer 19L, as provided in the first configuration illustrated in FIG. 4A or as provided in the second configuration illustrated in FIG. 4B, may be etched back by performing an etch-back process, which may comprise an isotropic etch process (e.g., a wet etch process) or an anisotropic etch process (e.g., a reaction ion etch process. The duration of the etch-back process may be selected such that the silicon oxide layer 19L has a second thickness that is less than the first thickness. The second thickness may be in a range from 10% to 90%, such as from 30% to 80%, of the first thickness. In one embodiment, the second thickness may be in a range from 1 nm to 5 nm.

In one embodiment, the silicon oxide layer 19L may have a two-dimensional array of tapered sidewalls that define a two-dimensional array of second openings. Thus, each portion of the silicon oxide layer 19L that is proximal to a second opening may have a respective variable vertical thickness at a respective tapered inner sidewall that defines the second opening. Portions of the silicon oxide layer 19L that are distal from the second openings may have a uniform thickness, which may be in a range from 1 nm to 5 nm.

In one embodiment, a bottom periphery of each second opening in the silicon oxide layer 19L may be laterally offset from a bottom periphery of a respective underlying first opening in the silicon oxide layer by a lateral offset distance that is greater than the second thickness, i.e., the thickness of the silicon oxide layer 19L as thinned.

The silicon oxide layer 19L may provide high etch selectivity during an anisotropic etch process that is subsequently used to pattern bottom electrodes of memory cells. In some embodiments, the high etch selectivity provided by the silicon oxide material of the silicon oxide layer 19L may increase the etch uniformity by about 20%, and increase the process yield of the patterning processes that patterns the array of memory cells. Further, the silicon oxide layer 19L may be thin enough not to effect the total thickness of the memory cells. Such high selectivity provided by the silicon oxide material reduces the topography of a subsequently deposited dielectric material, and provides elimination of a planarization process for the subsequently deposited dielectric material.

Figure 6:
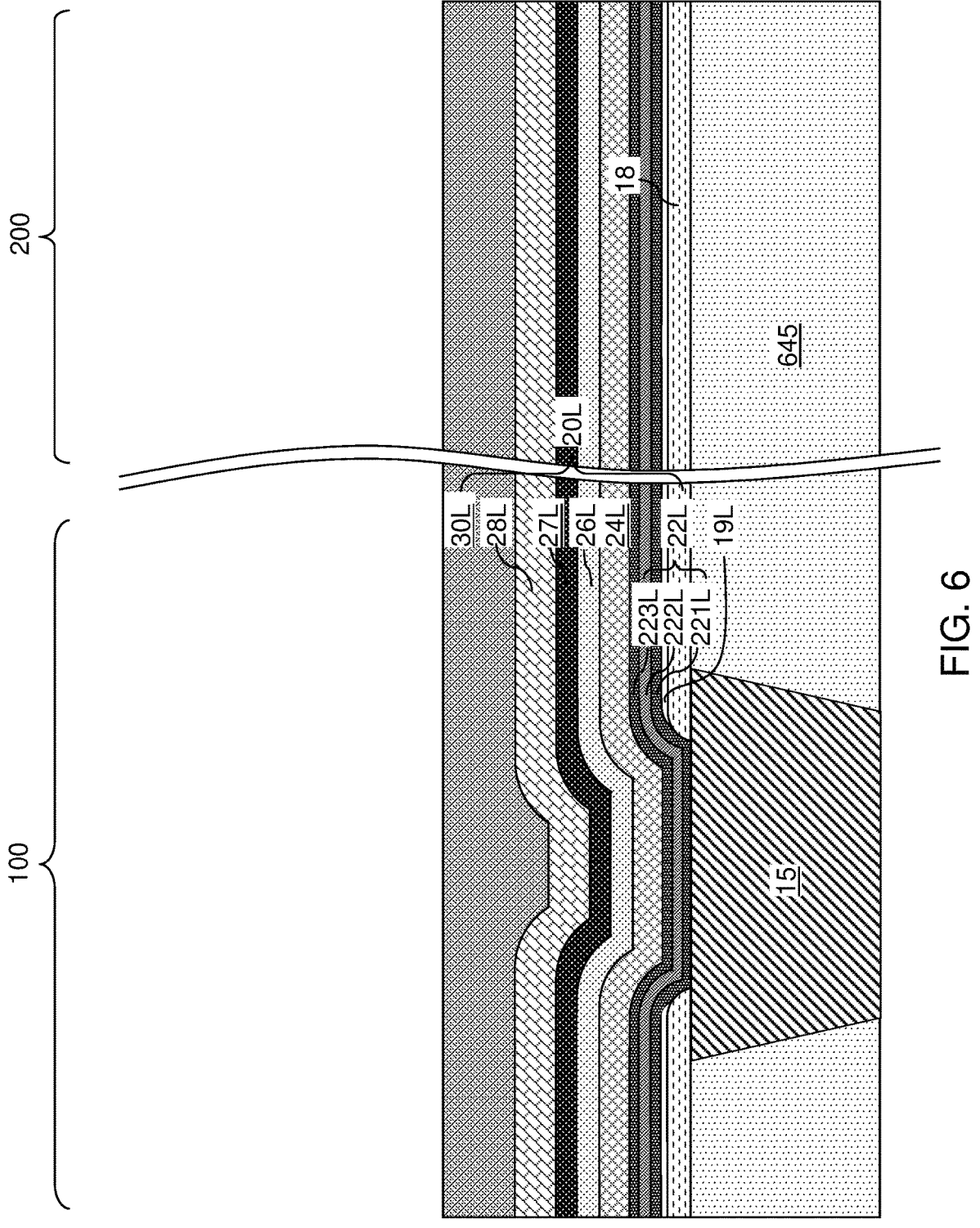
FIG. 6 is a vertical cross-sectional view of a region of the exemplary structure after formation of a layer stack including at least one bottom metallic barrier layer, a first electrode layer, a memory material layer, a metallic capping layer, a second electrode layer, and a hard mask layer according to an embodiment of the present disclosure.

Referring to FIG. 6, a layer stack (22L, 24L, 26L, 27L, 28L, 30L, collectively 20L) of material layers may be subsequently deposited over the silicon oxide layer 19L and the physically exposed surfaces of the bottom connection via structures 15. The layer stack (22L, 24L, 26L, 27L, 28L, 30L) may comprise, from bottom to top, at least one optional bottom metallic barrier layer 22L, a first electrode layer 24L, a memory material layer 26L, a metallic capping layer 27L, a second electrode layer 28L, and a hard mask layer 30L.

The at least one optional bottom metallic barrier layer 22L comprises at least one metallic barrier material such as titanium nitride, tantalum nitride, tungsten nitride, molybdenum nitride, titanium, tantalum, and/or tungsten. In an illustrative example, the at least one optional bottom metallic barrier layer 22L may comprises a layer stack including, from bottom to top, a first bottom metallic barrier layer 221L, a second bottom metallic barrier layer 222L, and a third bottom metallic barrier layer 223L. In an illustrative example, the first bottom metallic barrier layer 221L may comprise titanium nitride, the second bottom metallic barrier layer 222L may comprise tantalum, and the third bottom metallic barrier layer 223L may comprise tantalum nitride. The total thickness of the at least one bottom metallic barrier layer 22L may be in a range from 3 nm to 60 nm, such as from 6 nm to 30 nm, although lesser and greater thicknesses may also be used. Each of the at least one bottom metallic barrier layer 22L may be deposited by physical vapor deposition or chemical vapor deposition.

The first electrode layer 24L (which may also be referred to as a bottom electrode layer) may comprise a metallic material such as titanium nitride, tantalum, tungsten, platinum, ruthenium, iridium, molybdenum, niobium, rhenium, osmium, or another elemental metal having a melting temperature greater than 1,500 degrees Celsius. The thickness of the first electrode layer 24L may be in a range from 3 nm to 60 nm, such as from 6 nm to 30 nm, although lesser and greater thicknesses may also be used. The first electrode layer 24L may be deposited by physical vapor deposition or chemical vapor deposition.

The memory material layer 26L may include a resistive memory material. In one embodiment, the resistive memory material may comprise, and/or may consist essentially of, at least one filament-forming dielectric metal oxide material. As used herein, a filament-forming dielectric metal oxide material refers to a dielectric metal oxide material that is capable of forming filaments of oxygen-deficient regions (i.e., oxygen-deficiency filaments) upon application of an electrical bias that generates an electrical field having a magnitude that is greater than a respective threshold electrical field strength. In one embodiment, the filament-forming dielectric metal oxide material may be a non-stoichiometric oxygen-deficient dielectric metal oxide material.

In one embodiment, the filament-forming dielectric metal oxide material may comprise, and/or may consist of, a filament-forming metal oxide material that is a binary oxide material, i.e., a compound of a single metal element and oxygen. For example, the filament-forming dielectric metal oxide material may comprise, and/or may consist of, a material selected from $HfO_{2(1-\alpha)}$, $Ta_2O_{5(1-\beta)}$, and $Y_2O_{3(1-\gamma)}$. In this embodiment, each of $\alpha$, $\beta$, and $\gamma$ may be independently in a range from $1.0 \times 10^{-6}$ to $1.0 \times 10^{-1}$.

In one embodiment, the filament-forming dielectric metal oxide material may comprise, and/or may consist of, a respective filament-forming metal oxide material that is a ternary oxide material, i.e., a compound of two metal elements and oxygen. Non-limiting examples of such ternary filament-forming metal oxide material comprise hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), a doped $HfO_2$ (including a dopant selected from Si, Zr, Y, Al, Gd, Sr, La, Sc, Ge, etc.), and alloys of $HfO_{2(1-\alpha)}$, $Ta_2O_{5(1-\beta)}$, and $Y_2O_{3(1-\gamma)}$.

In one embodiment, may comprise, and/or may consist of, a respective filament-forming metal oxide material that is a quaternary oxide material, i.e., a compound of three metal elements and oxygen. Non-limiting examples of such quaternary filament-forming metal oxide material comprise lead zirconate titanate (PZT: $PbZr_xTi_yO_z$), barium strontium titanate ($BaSrTiO_x$), strontium bismuth tantalate (SBT: $SrBi_2Ta_2O_9$), and alloys of previously listed binary filament-forming metal oxide materials and/or ternary filament-forming metal oxide materials.

Generally, the dielectric metal oxide material in the memory material layer 26L may be free of fluorine atoms and nitrogen atoms, or may comprise fluorine atoms or nitrogen atoms only at a trace level (such as less than 1 part per million in atomic concentration). The memory material layer 26L may be formed by any suitable deposition process known in the art such as physical vapor deposition or chemical vapor deposition. The thickness of the memory material layer 26L may be in a range from 4 nm to 60 nm, such as from 6 nm to 30 nm, although lesser and greater thicknesses may also be used.

In an alternative embodiment, the memory material layer 26L may comprise, and/or may consist essentially of, a different type of resistive memory material. For example, the memory material layer 26L may comprise, and/or may consist essentially of, a phase change memory material or any other material or layer stack that may provide two different levels of electrical resistivity upon programming.

The metallic capping layer 27L may comprise at least one metallic barrier material such as titanium nitride, tantalum nitride, tungsten nitride, molybdenum nitride, titanium, tantalum, and/or tungsten. In an illustrative example, the metallic capping layer 27L may comprises a layer stack including two or more metallic barrier layers. In an illustrative example, the metallic capping layer 27L may comprise a layer stack including, from bottom to top, a titanium nitride and a tantalum nitride layer. The thickness of the metallic capping layer 27L may be in a range from 3 nm to 60 nm, such as from 6 nm to 30 nm, although lesser and greater thicknesses may also be used. The metallic capping layer 27L may be deposited by physical vapor deposition or chemical vapor deposition.

The second electrode layer 28L (which may also be referred to as a top electrode layer) may comprise a metallic material such as titanium nitride, tantalum, tungsten, platinum, ruthenium, iridium, molybdenum, niobium, rhenium, osmium, or another elemental metal having a melting temperature greater than 1,500 degrees Celsius. The thickness of the second electrode layer 28L may be in a range from 3 nm to 60 nm, such as from 6 nm to 30 nm, although lesser and greater thicknesses may also be used. The second electrode layer 28L may be deposited by physical vapor deposition or chemical vapor deposition.

A hard mask layer 30L may be deposited over the second electrode layer 28L. The hard mask layer 30L may include a material that may protect underlying material layers during a subsequent anisotropic etch process. The hard mask layer 30L may comprise a metallic material such as a titanium nitride, or may comprise a dielectric material such as silicon nitride, silicon nitride, silicon carbon nitride, silicon oxynitride, and/or a dielectric metal oxide (such as, but not limited to, titanium oxide and aluminum oxide). The thickness of the hard mask layer 30L may be in a range from 20 nm to 200 nm, such as from 30 nm to 100 nm, although lesser and greater thicknesses may also be used. The hard mask layer 30L may be deposited by chemical vapor deposition or physical vapor deposition.

One, a plurality, and/or each, of the layers within the layer stack 20L may be formed with a conformal profile that provides convex surface segments above each first opening in the etch-stop dielectric layer 18 and above each second opening in the silicon oxide layer 19L.

Figure 7:
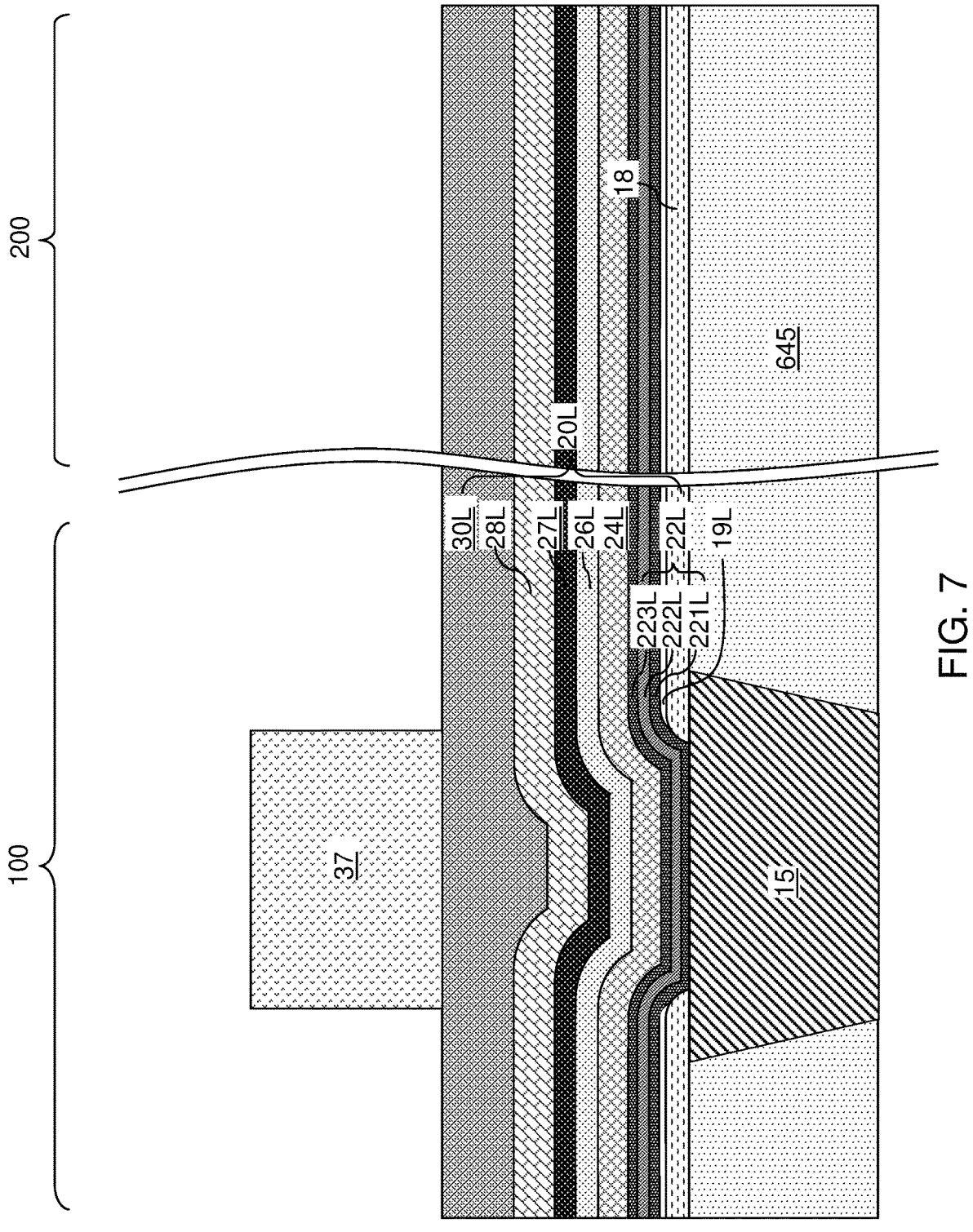
FIG. 7 is a vertical cross-sectional view of a region of the exemplary structure after formation of a patterned photoresist layer according to an embodiment of the present disclosure.

Referring to FIG. 7, a photoresist layer may be applied over the hard mask layer 30L, and may be lithographically patterned to form a patterned photoresist layer 37. The patterned photoresist layer 37 may comprise a two-dimensional periodic array of discrete photoresist material portions that overlie a respective one of the bottom connection via structures 15. As such, the two-dimensional periodic array of discrete photoresist material portions may have the same two-dimensional periodicity as the two-dimensional array of bottom connection via structures 15. Each of the discrete photoresist material portions may have an areal overlap with a respective underlying opening in the etch-stop dielectric layer 18. In one embodiment, each of the discrete photoresist material portions may have a periphery that is laterally offset outward with respective to a periphery of an underlying opening in the etch-stop dielectric layer 18 in a plan view (i.e., a top-down view). In one embodiment, each of the discrete photoresist material portions may have a periphery that is laterally offset inward with respective to a periphery of a top surface of a respective underlying bottom connection via structure 15 in the plan view.

Figure 8:
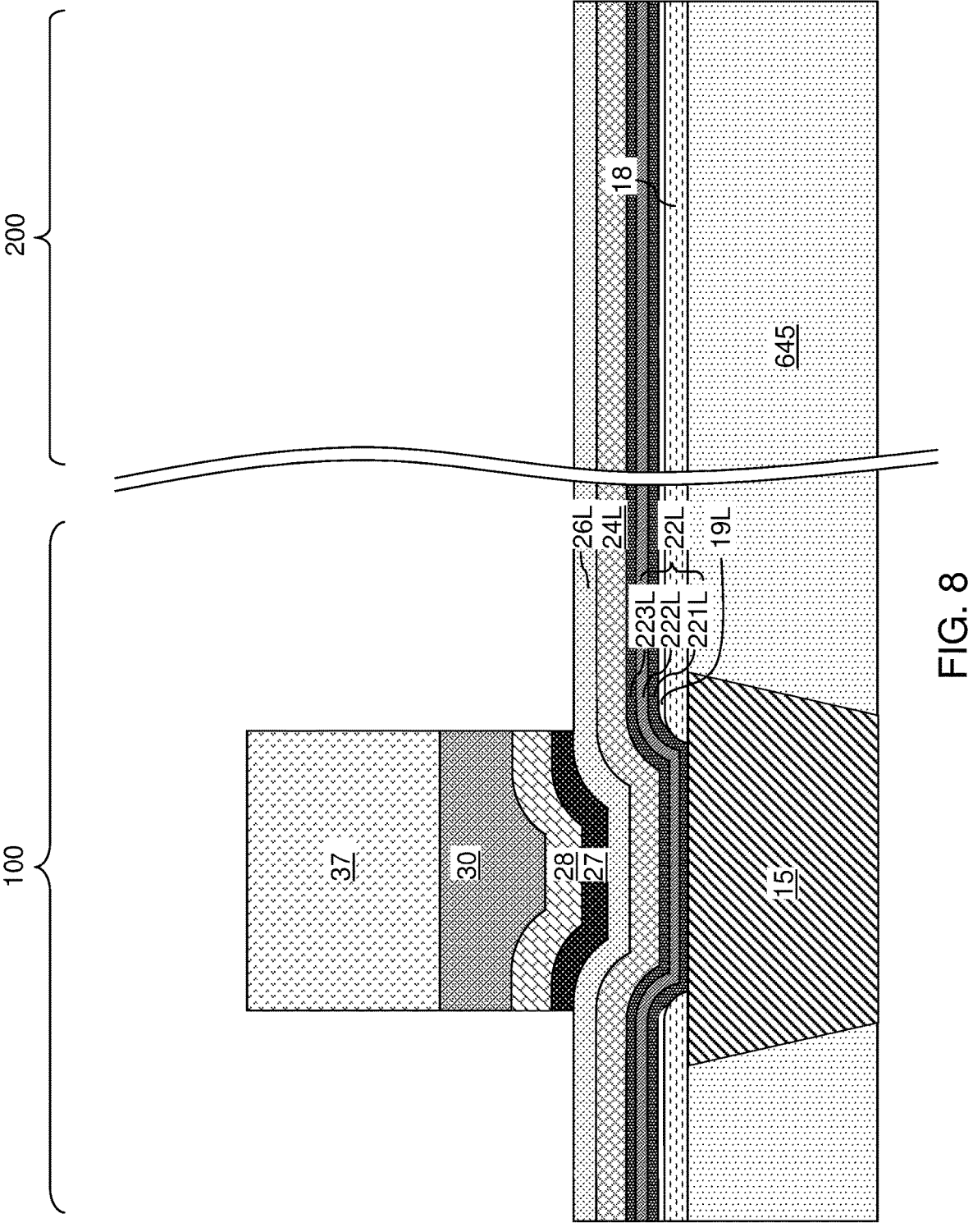
FIG. 8 is a vertical cross-sectional view of a region of the exemplary structure after patterning the hard mask layer, the second electrode layer, and the metallic capping layer according to an embodiment of the present disclosure.

Referring to FIG. 8, the pattern of the two-dimensional array of discrete photoresist material portions of the patterned photoresist layer 37 may be transferred through the hard mask layer 30L, the second electrode layer 28L, and the metallic capping layer 27L by performing a first anisotropic etch process. The second electrode layer 28L may be patterned into a two-dimensional array of second electrodes 28. The hard mask layer 30L may be patterned into a two-dimensional array of hard mask caps 30. The metallic capping layer 27L may be patterned into a two-dimensional array of metallic capping plates 27. The memory material layer 26L may be used as an etch stop layer for the first anisotropic etch process.

Each stack of a metallic capping plate 27 and a second electrode 28 constitutes a conductive structure, which is herein referred to as a top conductive structure or a second conductive structure (27, 28). Each second conductive structure (27, 28) comprises a second electrode 28 contacting a top surface of a metallic capping plate 27 and contacting a bottom surface of a hard mask cap 30. The patterned photoresist layer 37 may be subsequently removed, for example, by ashing.

Figure 9:
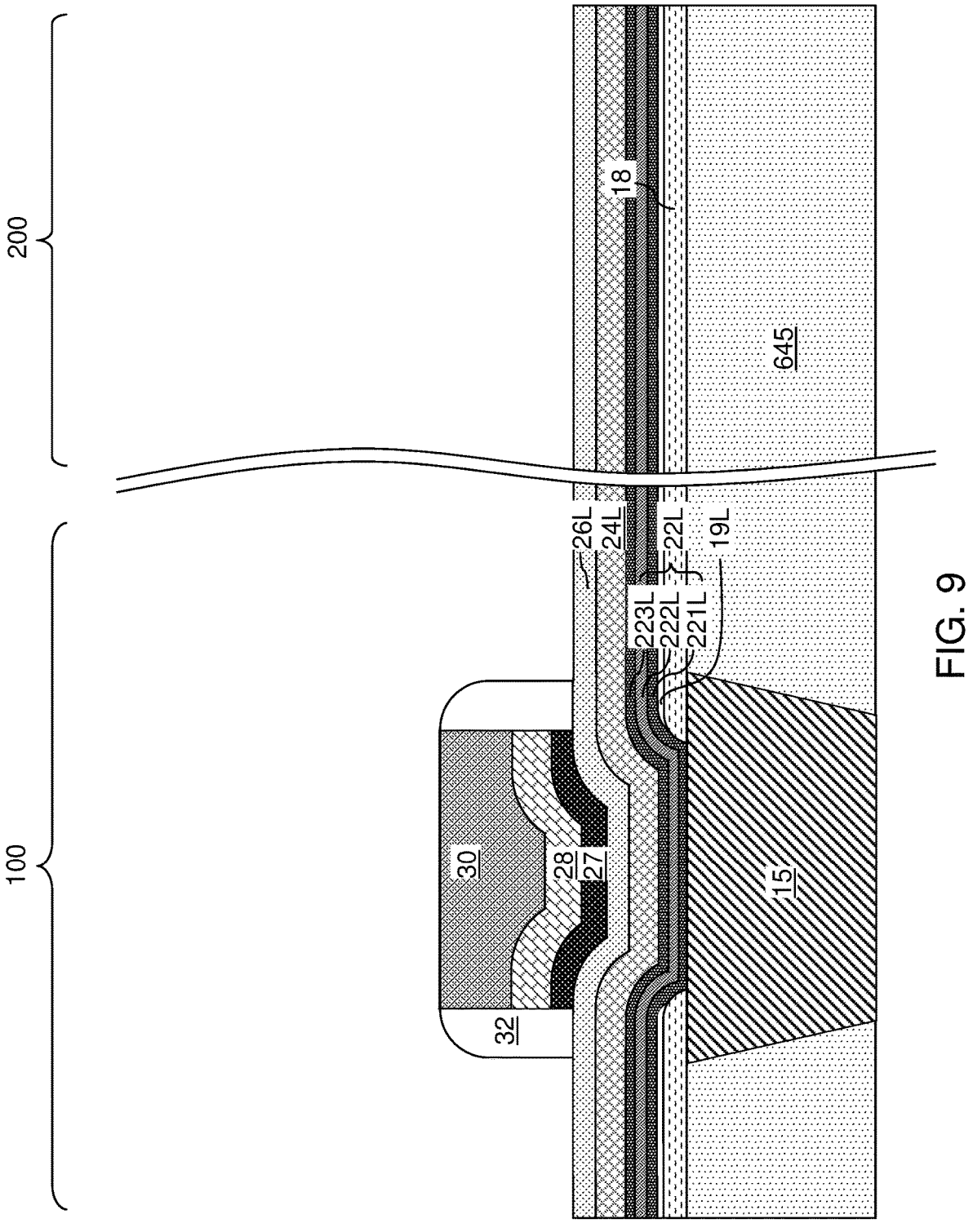
FIG. 9 is a vertical cross-sectional view of a region of the exemplary structure after formation of an array of dielectric spacers according to an embodiment of the present disclosure.

Referring to FIG. 9, an insulating material such as silicon nitride, silicon nitride carbide, or silicon oxide may be conformally deposited over the two-dimensional array of second electrodes 28 by a conformal deposition process (such as a chemical vapor deposition process) to form an insulating material layer. An anisotropic etch process may be performed to remove horizontally-extending portions of the insulating material layer. Each remaining cylindrical portion of the insulating material layer that laterally surrounds a respective stack of a metallic capping plate 27, a second electrode 28, and a hard mask cap 30 constitutes a dielectric spacer 32. Each dielectric spacer 32 laterally surrounds, and contacts sidewalls of, a respective hard mask cap 30, a respective metallic capping plate 27, and a respective second electrode 28, and contacts an annular top surface segment of the memory material layer 26L. The lateral thickness of each dielectric spacer 32, as measured between an inner sidewall and an outer sidewall, may be in a range from 4 nm to 80 nm, such as from 8 nm to 40 nm, although lesser and greater lateral thicknesses may also be used. Each dielectric spacer 32 laterally surrounding a respective second electrode 28.

Figure 10A:
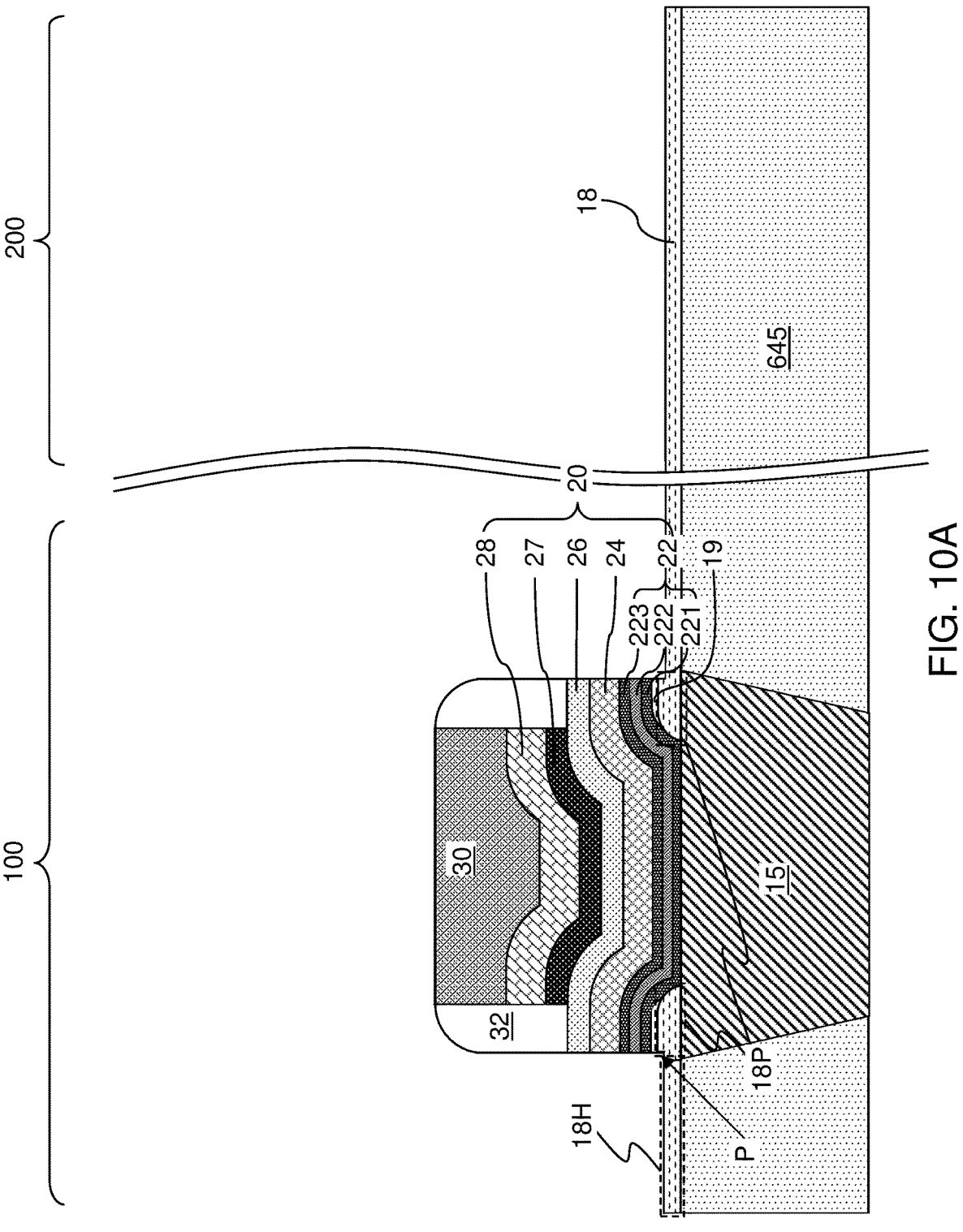
FIG. 10A is a vertical cross-sectional view of a region of the exemplary structure after patterning the memory material layer according to an embodiment of the present disclosure.
Figure 10B:
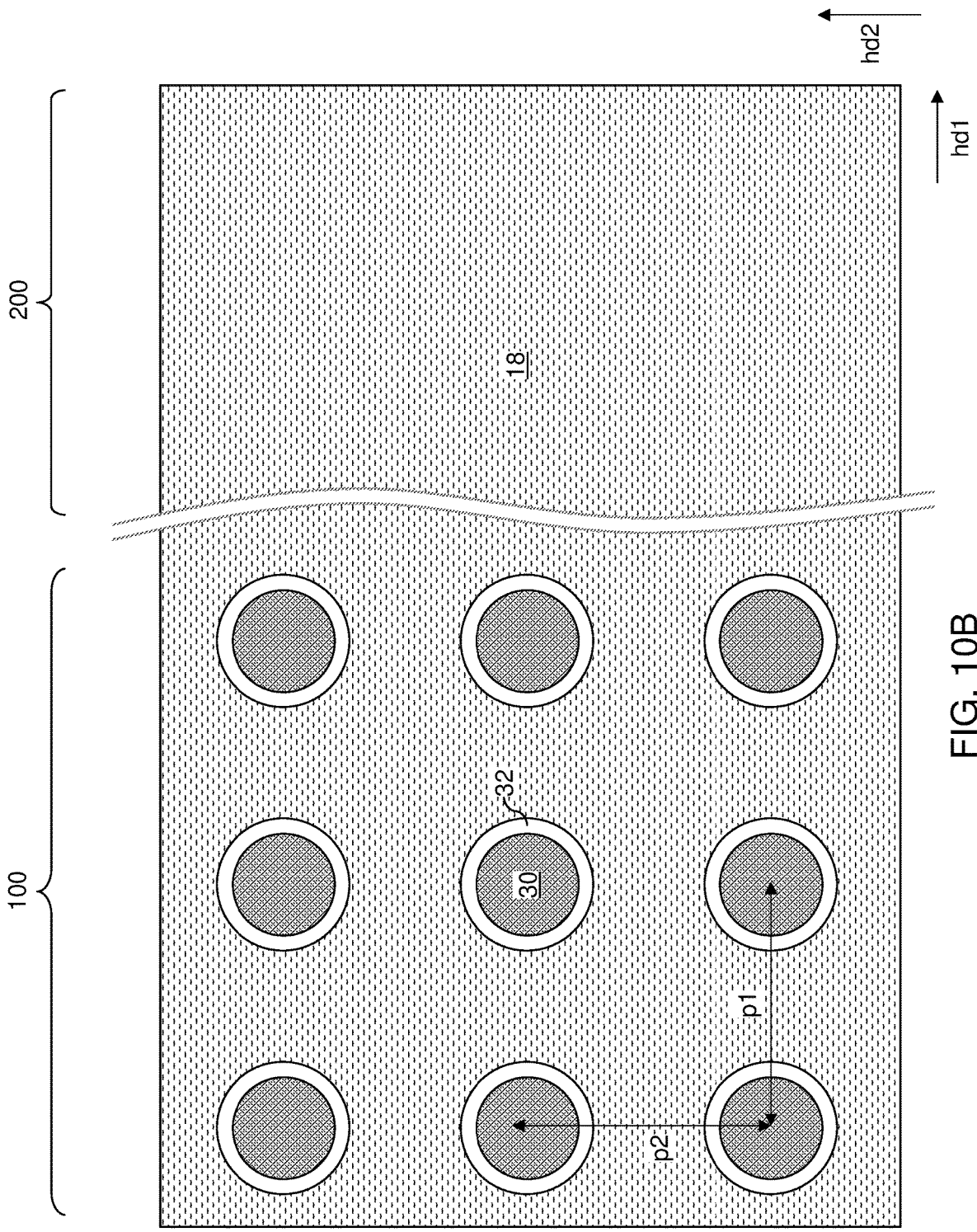
FIG. 10B is a top-down view of the exemplary structure at the processing steps of FIG. 10A.

Referring to FIGS. 10A and 10B, a second anisotropic etch process (or an ion milling process) may be performed to transfer the pattern in the two-dimensional array of combinations of a hard mask cap 30 and a dielectric spacer 32 through the memory material layer 26L, the first electrode layer 24L, and the at least one optional bottom metallic barrier layer 22L. Each patterned portion of the memory material layer 26L comprises a memory film 26. Each patterned portion of the first electrode layer 24L comprises a first electrode 24. Each patterned portion of the at least one optional bottom metallic barrier layer 22L (in embodiments that use it) comprises at least one optional bottom metallic barrier plate 22. Each contiguous combination of a bottom metallic barrier plate 22 and a first electrode 24 constitutes a bottom conductive structure, or a first conductive structure (22, 24).

According to an aspect of the present disclosure, the silicon oxide layer 19L may be used as an etch stop layer during an etch step within the second anisotropic etch process (or the ion milling process) that patterns the first electrode layer 24L and the at least one optional bottom metallic barrier layer 22L. Generally, any metal etch chemistry that is selective to silicon oxide may be used for the etch step within the second anisotropic etch process. Alternatively, an ion milling process may be used in lieu of the second anisotropic etch process. As used herein, an ion milling process is considered to be a type of anisotropic etch process in which non-reactive ions are used to pattern a structure (as opposed to reaction ions that are used in reactive ion etch processes). In one embodiment, portions of the silicon oxide layer 19L that are not masked by the hard mask caps 30 or the dielectric spacers 32 may be collaterally etched by the etch step within the second anisotropic etch process, or may be etched by an additional etch step within the second anisotropic etch process. In embodiments in which an additional etch step is used, the additional etch step may have an etch chemistry that is selective to the material of the etch-stop dielectric layer 18 so that the overetch into the etch-stop dielectric layer 18 is minimized. Remaining portions of the silicon oxide layer 19L constitutes a two-dimensional array of silicon oxide plates 19.

In one embodiment, the optional bottom metallic barrier plate 22 may comprise a stack of a first bottom metallic barrier plate 221 (which is a patterned portion of the first bottom metallic barrier layer 221L), a second bottom metallic barrier plate 222 (which is a patterned portion of the second bottom metallic barrier layer 222L), and a third bottom metallic barrier plate 223 (which is a patterned portion of the third bottom metallic barrier layer 223L). In one embodiment, the memory film 26 includes at least one dielectric metal oxide layer including an oxygen-deficient filament-forming dielectric metal oxide material. Alternatively, the memory film 26 may comprise a different type of resistive memory material such as a phase change material.

Generally, portions of the memory material layer 26L and the first electrode layer 24L that are located outside the areas of the combination of the two-dimensional array of hard mask caps 30 and the two-dimensional array of dielectric spacers 32 may be anisotropically etched during the second anisotropic etch process. Remaining portions of the memory material layer 26L and the first electrode layer 24L comprise memory films 26 and first electrodes 24.

Each contiguous set of at least one optional bottom metallic barrier plate 22, a first electrode 24, a memory film 26, a metallic capping plate 27, and a second electrode 28 constitutes a memory cell 20. A two-dimensional periodic array of memory cells 20 may be formed. The two-dimensional periodic array of memory cells 20 may have the first pitch p1 along the first horizontal direction hd1, and the second pitch along the second horizontal direction hd1. In one embodiment, each interface between a memory film 26 and a first electrode 24 may comprise a horizontal central segment, a contoured annular segment in which a convex surface of the first electrode 24 contacts a concave surface of the memory film 26, and a horizontal annular segment adjoined to an outer periphery of the contoured annular segment. Each interface between a memory film 26 and a metallic capping plate 27 may comprise a horizontal central segment, a contoured annular segment in which a concave surface of the metallic capping plate 27 contacts a convex surface of the memory film 26, and a horizontal annular segment adjoined to an outer periphery of the contoured annular segment.

In one embodiment, within each memory cell 20, a sidewall or sidewalls of at least one optional bottom metallic barrier plate 22, a sidewall or sidewalls of a first electrode 24, and a sidewall or sidewalls of a memory film 26 may be vertically coincident, i.e., may be contained in a vertical plane. In an illustrative embodiment in which a memory cell 20 has a horizontal cross-sectional shape of a circle, the vertical plane may be a cylindrical vertical plane. In one embodiment, within each memory cell 20, a sidewall or sidewalls of a second electrode 28, a sidewall or sidewalls of a metallic capping plate 27, and a sidewall or sidewalls of a hard mask cap 30 may be vertically coincident.

The second anisotropic etch process may have an etch chemistry that is selective to the silicon oxide material of the silicon oxide layer 19L and selective to the material of the etch-stop dielectric layer 18. While the silicon oxide layer 19L is effective as an etch stop material, the silicon oxide layer 19L is generally very thin within a thickness in a range from 1 nm to 5 nm. As such, the silicon oxide layer 19L is etched through to form a two-dimensional array of silicon oxide plates 19. A collateral etching of a top portion of the etch-stop dielectric layer 18 may occur at a terminal portion of the second anisotropic etch process. In one embodiment, the etch-stop dielectric layer 18 underlies each of the first electrodes 24, and comprises a horizontally-extending portion 18H and a two-dimensional array of vertically protruding portions, which are herein referred to as pedestal portions 18P. Each of the vertically-protruding portions, i.e., the pedestal portions 18P, comprises a sidewall that is vertically coincident with a sidewall of a first electrode 24 and has a bottom periphery P that is adjoined to a periphery of the horizontally-extending portion 18H. The etch-stop dielectric layer 18 comprises an opening therethrough within an area of each of the first electrodes 24 in a plan view.

Generally, the layer stack (22L, 24L, 26L, 27L, 28L, 30L) and the silicon oxide layer 19L as formed at the processing steps of FIG. 6 may be patterned by performing at least one anisotropic etch process. A two-dimensional array of patterned material stacks (19, 22, 24, 26, 27, 28, 30) may be formed, which includes a two-dimensional array of silicon oxide plates 19 and a two-dimensional array of memory cells 20. Each memory cell 20 includes a first electrode 24, a memory film 26, and a second electrode 28. In one embodiment, the at least one anisotropic etch process comprises a first anisotropic etch process and a second anisotropic etch process. In this embodiment, the patterned photoresist layer 37 may be used as an etch mask during the first anisotropic etch process, and the combination of the hard mask caps 30 and the dielectric spacers 32 may be used as an etch mask during the second anisotropic etch process.

A two-dimensional array of memory cells 20 may be formed over a two-dimensional array of silicon oxide plates 19. Each of the memory cells 20 comprises a first conductive structure (22, 24), a memory film 26 contacting a top surface of the first conductive structure (22, 24), and a second conductive structure (27, 28) contacting a top surface of the memory film 26. Each of the first conductive structures (22, 24) comprises a respective first electrode 24 and extends through a respective second opening in a respective silicon oxide plate 19 and a respective first opening in the etch-stop dielectric layer 18. Each of the memory films 26 comprises a material that provides at least two resistive states having different electrical resistivity. Each of the second conductive structures (27, 28) comprises a respective second electrode 28.

Underneath each memory cell 20, a periphery of a second opening through a silicon oxide plate 19 is laterally offset outward from a periphery of a first opening in the etch-step dielectric material layer 18. The etch-stop dielectric layer 18 may comprise a horizontally-extending portion 18H having a uniform thickness throughout and located outside an area of the first conductive structures (22, 24), and pedestal portions 18P having a respective outer sidewall. A bottom periphery of the outer sidewall of each pedestal portion 18P is adjoined to a periphery of a top surface of the horizontally-extending portion 18H. The etch-stop dielectric layer 18 contacts top surfaces of the bottom connection via structures 15 within the two-dimensional array of bottom connection via structures 15, and contacts a top surface of a topmost dielectric material layer within the dielectric material layers (601, 610, 620, 630, 645), and comprises a horizontally-extending portion 18H and a two-dimensional array of pedestal portions 18P.

In one embodiment, each silicon oxide plate 19 may be located on a top surface of a respective pedestal portion 18P of the etch-stop dielectric layer 18. In one embodiment, each silicon oxide plate 19 comprises a tapered inner sidewall and a straight outer sidewall, and the straight outer sidewall of each silicon oxide plate 19 may be vertically coincident with the outer sidewall of a respective underlying pedestal portion 18P.

In one embodiment, each annular tapered sidewall of the etch-stop dielectric layer 18 may comprise a top periphery that is adjoined to an annular top surface of a respective pedestal portion 18P of the etch-stop dielectric layer 18, and a bottom periphery located at, or below, a horizontal plane including a bottom surface of the horizontally-extending portion 18H of the etch-stop dielectric layer 18.

In one embodiment, each first conductive structure (22, 24) may comprise a bottom metallic barrier plate 22 contacting a bottom surface of a respective first electrode 24, and contacting a planar top surface of a respective silicon oxide plate 19, contacting a tapered inner sidewall of a second opening of the respective silicon oxide plate 19, and contacting a tapered inner sidewall of a respective first opening of the etch-stop dielectric layer 18.

Figure 11A:
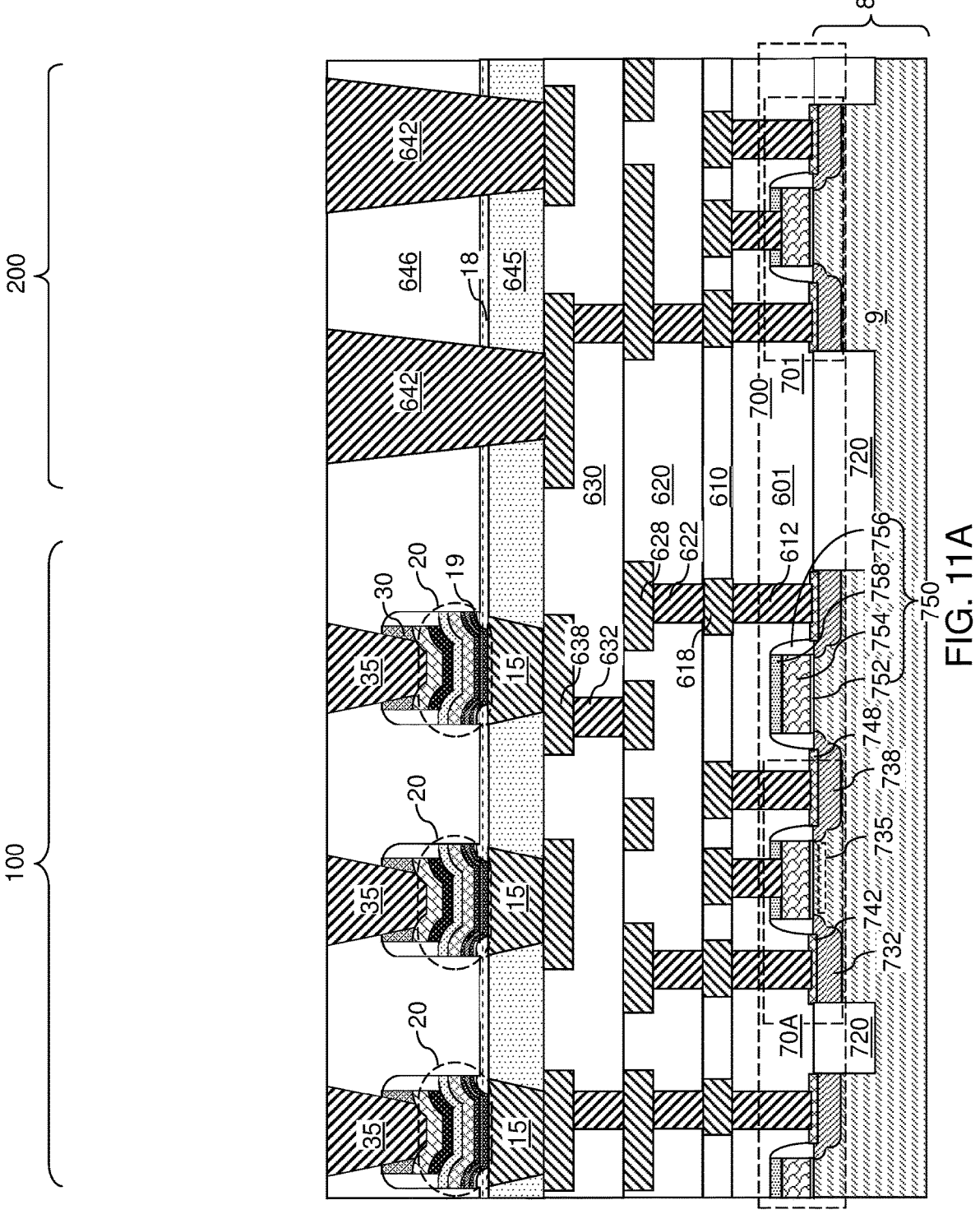
FIG. 11A is a vertical cross-sectional view of the exemplary structure after formation of an upper via-level dielectric material layer and top connection via structures according to an embodiment of the present disclosure.
Figure 11B:
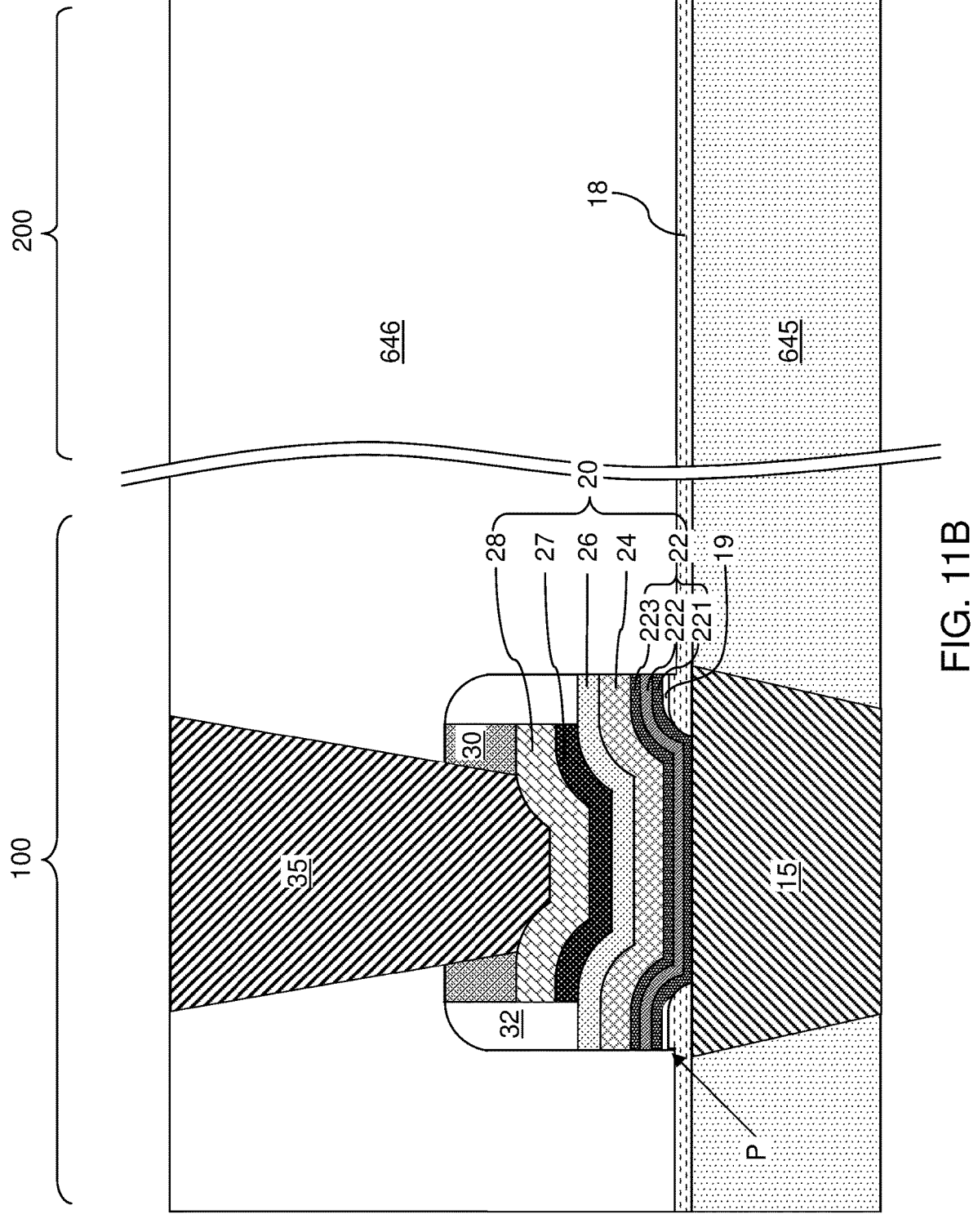
FIG. 11B is a magnified view a region of the exemplary structure at the processing steps of FIG. 11A.

Referring to FIGS. 11A and 11B, an upper via-level dielectric material layer 646 may be formed over the two-dimensional array of memory cells 20 and the hard mask caps 30. The upper via-level dielectric material layer 646 may comprise any dielectric material that may be used for the lower via-level dielectric material layer 645. In one embodiment, the upper via-level dielectric material layer 646 may comprise a planarizable dielectric material such as silicon oxide, or may comprise a self-planarizing dielectric material such as a spin-on dielectric material. In this embodiment, the top surface of the upper via-level dielectric material layer 646 may be formed as a planar or a semi-planar surface. The thickness of the upper via-level dielectric material layer 646 may be selected such that the top surface of the upper via-level dielectric material layer 646 is formed above the horizontal plane including the top surfaces of the hard mask caps 30. According to an aspect of the present disclosure, topographic variations of the top surface of the upper via-level dielectric material layer 646 may be small enough to provide subsequent patterning of via cavities therein, and a separate planarization process for the upper via-level dielectric material layer 646 may not be necessary.

Via cavities may be formed above the two-dimensional array of memory cells 20 and over the metal interconnect structures (such as the third metal line structures 638) in the peripheral region 200. Top surfaces of the second electrodes 28 may be physically exposed at the bottom of the via cavities formed in the memory array region 100, and top surface of underlying metal interconnect structures may be physically exposed at the bottom of the via cavities formed in the peripheral region 200. At least one metallic material (such as a combination of a metallic barrier liner and a metallic fill material) may be deposited within each of the via cavities, and excess portions of the at least one metallic material may be removed from above the top surface of the upper via-level dielectric material layer 646 by a planarization process. The planarization process may comprise a chemical mechanical polishing (CMP) process or a recess etch process. Each remaining portion of the at least one metallic material filling a via cavity that overlies a memory cell 20 constitutes a top connection via structure 35. Each remaining portion of the at least one metallic material filling a via cavity in the peripheral region 200 constitutes a third metal via structure 642. Each top connection via structure 35 contacts a second electrode 28.

Figure 12A:
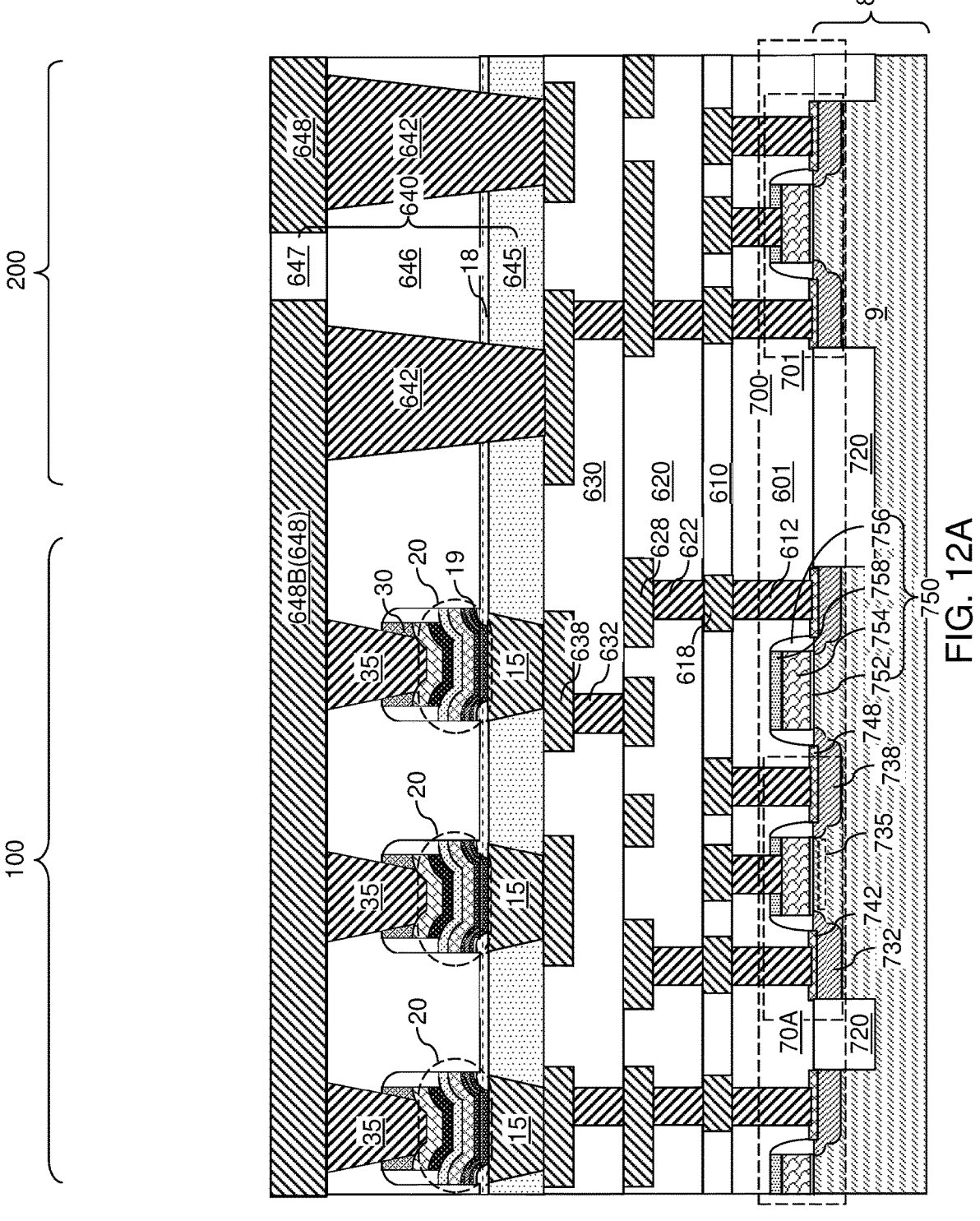
FIG. 12A is a vertical cross-sectional view of the exemplary structure after formation of bit lines according to an embodiment of the present disclosure.
Figure 12B:
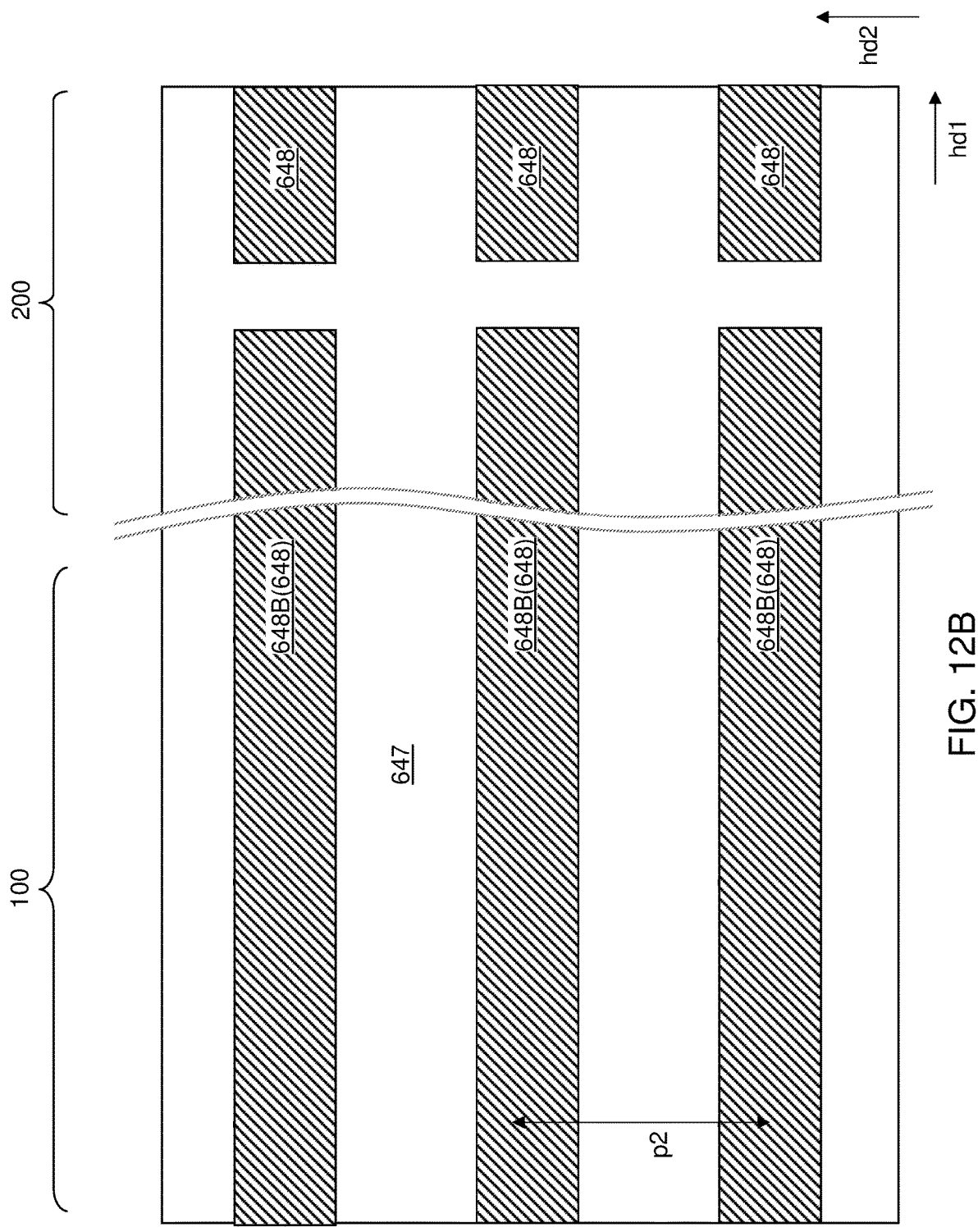
FIG. 12B is a top-down view of the exemplary structure of FIG. 12A.

Referring to FIGS. 12A and 12B, a line-level dielectric material layer 647 may be deposited over the upper via-level dielectric layer 646. The combination of the lower via-level dielectric material layer 645, the etch-stop dielectric layer 18, the upper via-level dielectric material layer 646, and the line-level dielectric material layer 647 constitutes an interconnect-level dielectric material layer such as a fourth interconnect-level dielectric material layer 640.

Line cavities may be formed in the line-level dielectric material layer 647, and may be filled with at least one metallic material (such as a combination of a metallic barrier liner and a metallic fill material) to form metal line structures, which are herein referred to as fourth metal line structures 648. In one embodiment, a subset of the fourth metal line structures 648 may comprise bit lines 648B that laterally extend along the first horizontal direction hd1. Each of the bit lines 648B may contact a respective row of top connection via structures 35 arranged along the first horizontal direction hd1. In one embodiment, the bit lines 648B may be periodic along the second horizontal direction hd2 with a periodicity of the second pitch p2.

Figure 13:
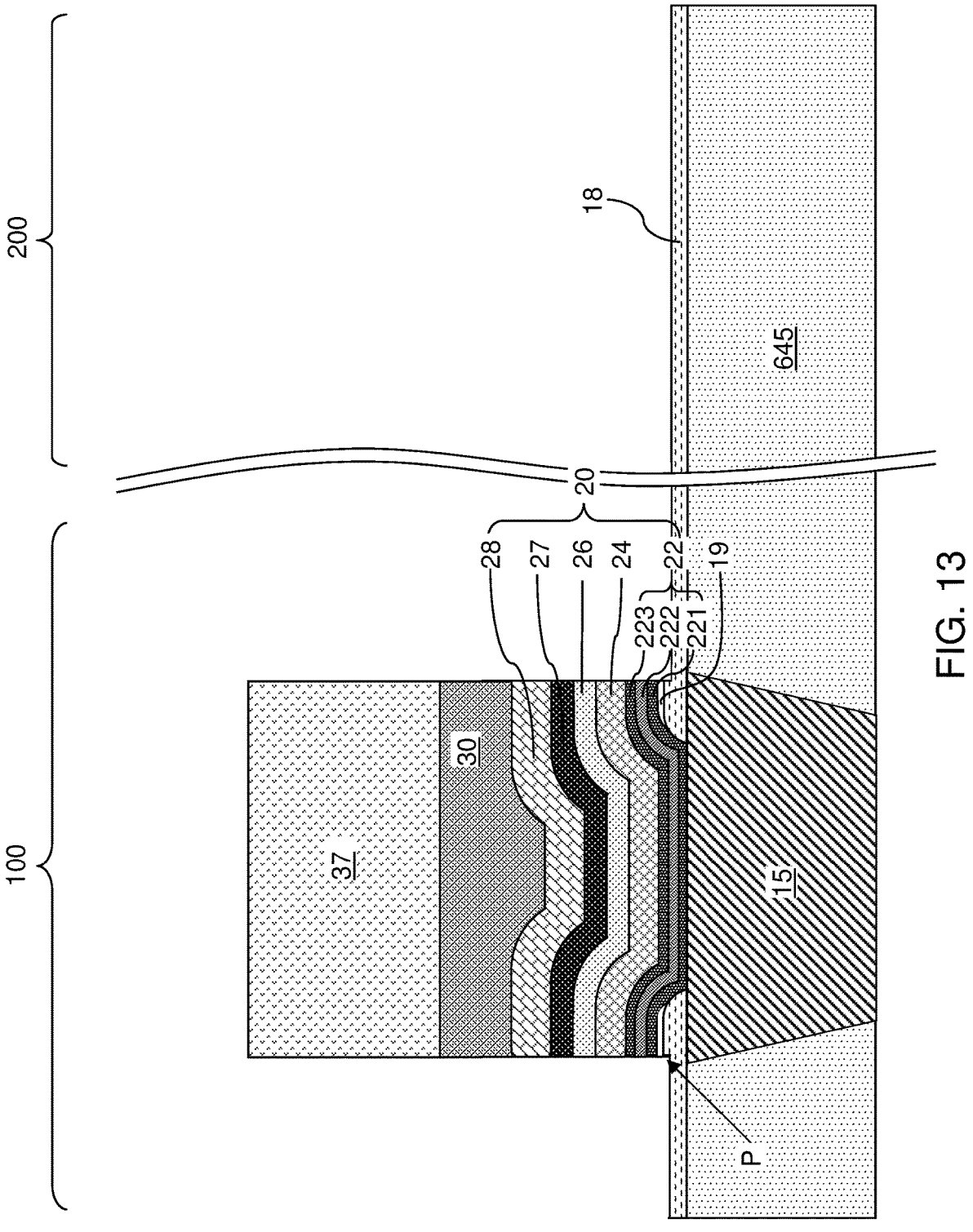
FIG. 13 is a vertical cross-sectional view of a region of an alternative configuration of the exemplary structure after patterning the memory cell according to an embodiment of the present disclosure.

Referring to FIG. 13, an alternative configuration of the exemplary structure may be derived from the exemplary structure of FIG. 7 by increasing the area of each patterned photoresist material portion in the patterned photoresist layer 37. In this embodiment, the area of each patterned photoresist material portion of the patterned photoresist layer 37 in the alternative configuration of the exemplary structure may be about the same as the area of a contiguous combination of a hard mask cap 30 and a dielectric spacer 32 in the exemplary structure illustrated in FIG. 10B.

Generally, the layer stack (22L, 24L, 26L, 27L, 28L, 30L) and the silicon oxide layer 19L may be patterned by performing at least one anisotropic etch process (which may comprise an ion milling process). In the alternative configuration of the exemplary structure, a patterned material stack (19, 22, 24, 26, 27, 28, 30) including a first electrode 24, a memory film 26, and a second electrode 28 is formed over a silicon oxide plate 19 by performing the at least one anisotropic etch process using the patterned photoresist layer 37 and/or a two-dimensional array of hard mask caps 30 that has a same pattern as the patterned photoresist layer 37. In this embodiment, each sidewall of the memory film 26 is vertically coincident with a sidewall of respective overlying second electrode 28, a sidewall of a respective overlying metallic capping plate 27, and a sidewall of a respective overlying hard mask cap 30.

Figure 14:
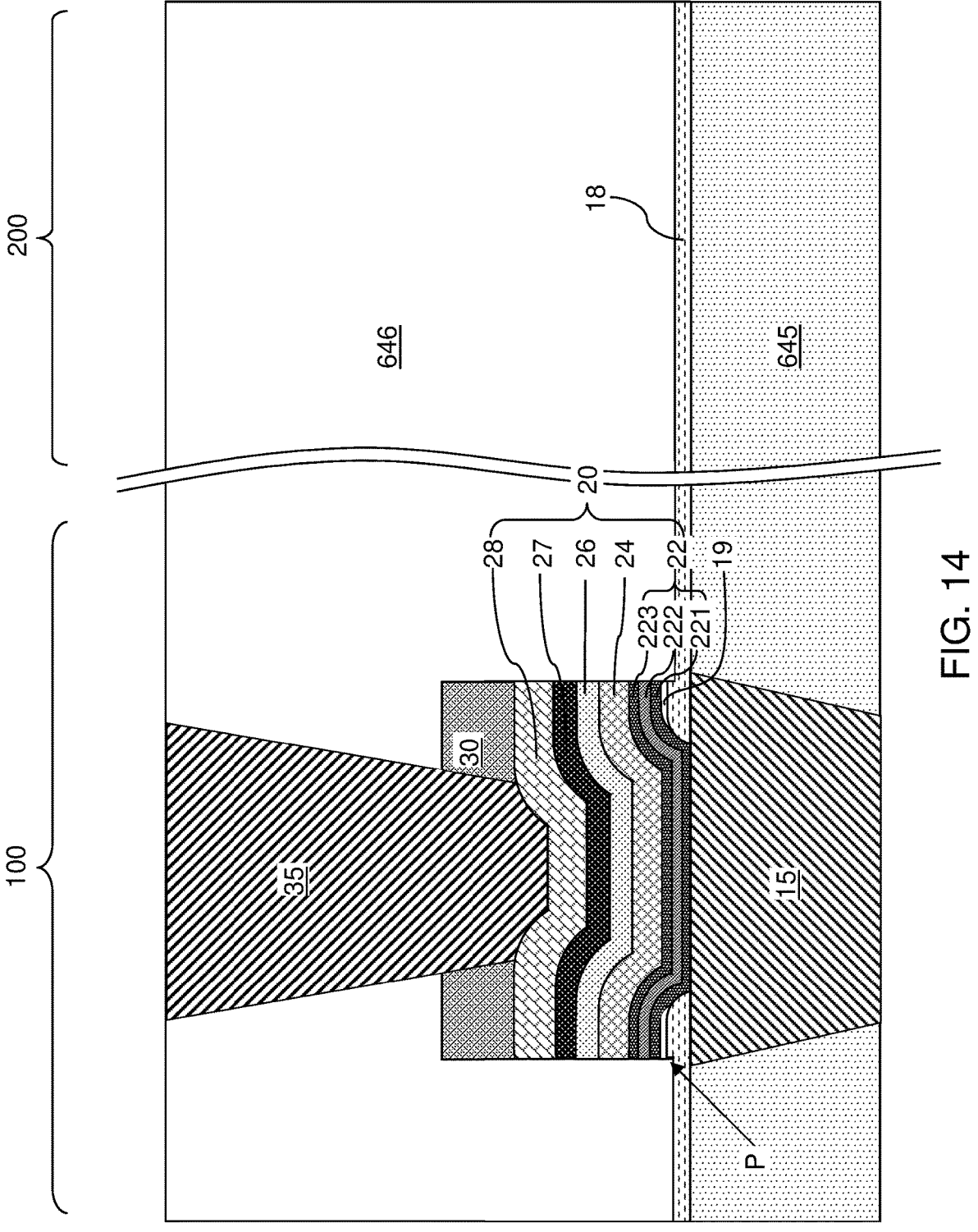
FIG. 14 is a vertical cross-sectional view of a region of the alternative configuration of the exemplary structure after formation of an upper via-level dielectric material layer and top connection via structures according to an embodiment of the present disclosure.

Referring to FIG. 14, the processing steps of FIGS. 11A and 11B may be performed to form an upper via-level dielectric material layer 646 and top connection via structures 35.

Figure 15:
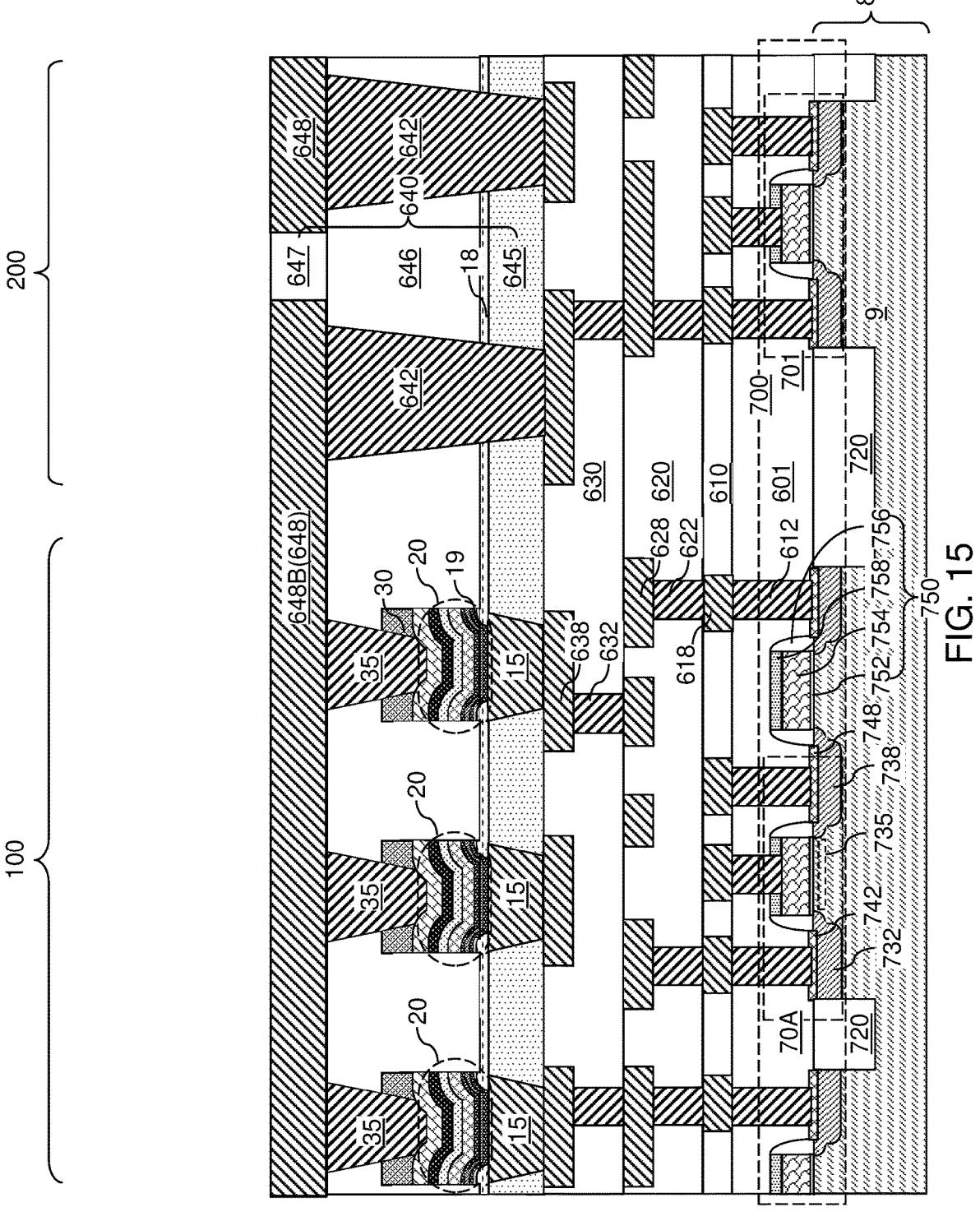
FIG. 15 is a vertical cross-sectional view of the alternative configuration of the exemplary structure after formation of bit lines according to an embodiment of the present disclosure.

Referring to FIG. 15, the processing steps of FIGS. 12A and 12B may be performed to form bit lines 648B.

FIG. 16 is a flowchart that illustrates the general processing steps for manufacturing the semiconductor device of the present disclosure.

Referring to step 1610 and FIGS. 1-3, an etch-stop dielectric layer 18 overlying a substrate 8 may be formed.

Referring to step 1620 and FIG. 3, a silicon oxide layer 19L may be formed over the etch-stop dielectric layer 18.

Referring to step 1630 and FIGS. 4A, 4B, and 5, an opening may be formed through the silicon oxide layer 19L and the etch-stop dielectric layer 18.

Referring to step 1640 and FIG. 6, a layer stack (22L, 24L, 26L, 27L, 28L, 30L) comprising a first electrode layer 24L, a memory material layer 26L, and a second electrode layer 28L may be formed over the opening and over the silicon oxide layer 19L.

Referring to step 1650 and FIGS. 7-15, the layer stack (22L, 24L, 26L, 27L, 28L, 30L) and the silicon oxide layer 19L may be patterned by performing at least one anisotropic etch process. A patterned material stack (19, 22, 24, 26, 27, 28, 30) including a first electrode 24, a memory film 26, and a second electrode 28 is formed over a silicon oxide plate 19. The silicon oxide plate 19 comprises a patterned portion of the silicon oxide layer 19L. The first electrode 24 comprises a patterned portion of the first electrode layer 24L. The memory film 26 comprises a patterned portion of the memory material layer 26L. The second electrode 28 comprises a patterned portion of the second electrode layer 28L.

Referring to all drawings and according to various embodiments of the present disclosure, a semiconductor structure is provided, which comprises: an etch-stop dielectric layer 18 overlying a substrate 8 and comprising a first opening therethrough; a silicon oxide plate 19 overlying the etch-stop dielectric layer 18 and comprising a second opening therethrough; a first conductive structure (22, 24) comprising a first electrode 24 and extending through the second opening and the first opening; a memory film 26 contacting a top surface of the first conductive structure (22, 24) and comprising a material that provides at least two resistive states having different electrical resistivity; and a second conductive structure (27, 28) comprising a second electrode 28 and contacting a top surface of the memory film 26.

In one embodiment, the first conductive structure (22, 24) comprises a sidewall that is vertically coincident with an outer periphery of the silicon oxide plate 19. In one embodiment, a periphery of the second opening is laterally offset outward from a periphery of the first opening. In one embodiment, the etch-stop dielectric layer 18 comprises: a horizontally-extending portion 18H having a uniform thickness throughout and located outside an area of the first conductive structure (22, 24); and a pedestal portion 18P having an outer sidewall, wherein a bottom periphery of the outer sidewall of the pedestal portion 18P is adjoined to a periphery of a top surface of the horizontally-extending portion 18H. In one embodiment, the silicon oxide plate 19 is located on a top surface of the pedestal portion 18P of the etch-stop dielectric layer 18. In one embodiment, the silicon oxide plate 19 comprises a tapered inner sidewall and a straight outer sidewall; and the straight outer sidewall of the silicon oxide plate 19 is vertically coincident with the outer sidewall of the pedestal portion 18P. In one embodiment, an annular tapered sidewall of the etch-stop dielectric layer 18 comprises: a top periphery that is adjoined to an annular top surface of the pedestal portion 18P of the etch-stop dielectric layer 18; and a bottom periphery located at, or below, a horizontal plane including a bottom surface of the horizontally-extending portion 18H of the etch-stop dielectric layer 18. In one embodiment, the silicon oxide plate 19 has a shape of an annular plate having a uniform vertical thickness in an outer portion adjoined to an outer sidewall and having a variable vertical thickness at a tapered inner sidewall that defines the second opening. In one embodiment, the planar silicon oxide plate 19 comprises a silicon oxide material including decomposition products of tetraethyl orthosilicate (TEOS) and contains: carbon atoms at an atomic concentration of at least 100 parts per million; and hydrogen atoms at an atomic concentration of at least 100 parts per million. In one embodiment, a bottom periphery of the second opening is laterally offset from a bottom periphery of the first opening by a lateral offset distance that is greater than a thickness of the planar silicon oxide plate 19. In one embodiment, the first conductive structure (22, 24) comprises a bottom metallic barrier plate 22 contacting a bottom surface of the first electrode 24, and contacting a planar top surface of the silicon oxide plate 19, contacting a tapered inner sidewall of the second opening of the silicon oxide plate 19, and contacting a tapered inner sidewall of the first opening of the etch-stop dielectric layer 18. In one embodiment, the second conductive structure (27, 28) comprises a metallic capping plate 27 contacting a bottom surface of the second electrode 28 and contacting a top surface of the memory film 26. In one embodiment, the semiconductor structure comprises a dielectric spacer 32 laterally surrounding, and contacting sidewalls of, the hard mask cap 30, the metallic capping plate 27, and the second electrode 28, and contacting an annular top surface segment of the memory film 26. In one embodiment, a sidewall of the memory film 26 is vertically coincident with a sidewall of the second electrode 28, a sidewall of the metallic capping plate 27, and a sidewall of the hard mask cap 30.

According to an aspect of the present disclosure, a semiconductor structure is provided, which comprises: an etch-stop dielectric layer 18 overlying a substrate 8 and comprising a two-dimensional array of first opening therethrough; a two-dimensional array of silicon oxide plates 19 overlying the etch-stop dielectric layer 18 and comprising a respective second opening therethrough, wherein each of the second openings is laterally offset outward from a respective under-lying first opening in the etch-stop dielectric layer 18; and a two-dimensional array of memory cells 20 located over the two-dimensional array of silicon oxide plates 19, wherein: each of the memory cells 20 comprises a first conductive structure (22, 24), a memory film 26 contacting a top surface of the first conductive structure (22, 24), and a second conductive structure (27, 28) contacting a top surface of the memory film 26; each of the first conductive structures (22, 24) comprises a respective first electrode 24 and extends through a respective second opening and a respective first opening; each of the memory films 26 comprises a material that provides at least two resistive states having different electrical resistivity; and each of the second conductive structures (27, 28) comprises a respective second electrode 28.

In one embodiment, the semiconductor structure com-prises: a two-dimensional array of access transistors 70A located on the substrate 8, wherein each access transistor 70A within the two-dimensional array of access transistors 70A is electrically connected to a respective memory cell 20 within the two-dimensional array of memory cells 20; and metal interconnect structures (612, 618, 622, 628, 632, 638, 15) located within dielectric material layers (601, 610, 620, 630, 645) and providing electrical connection between the two-dimensional array of access transistors 70A and the two-dimensional array of memory cells 20. In one embodi-ment, the metal interconnect structures (612, 618, 622, 628, 632, 638, 15) comprises a two-dimensional array of via structures (such as bottom connection via structures 15); and the etch-stop dielectric layer 18 contacts top surfaces of the via structures within the two-dimensional array of via struc-tures and contacts a top surface of a topmost dielectric material layer (such as a lower via-level dielectric layer 645) within the dielectric material layers (601, 610, 620, 630, 645), and comprises a horizontally-extending portion 18H and a two-dimensional array of pedestal portions 18P.

The various embodiments of the present disclosure reduces a step height, as defined as the vertical distance between the horizontal plane including the top surface of the horizontally-extending portion of the etch-stop dielectric layer 18 and the horizontal plane including the topmost surfaces of the hard mask caps 20. The reduction in the step height is estimated to be about 11% compared to an alter-native structure in which the silicon oxide plates 19 are replaced with silicon carbide plates.

Reduction of the height of the memory cells 20 may be effected by the high etch selectivity that the silicon oxide material of the silicon oxide layer 19L provides during patterning of the memory cells 20. Further, silicon oxide does not absorb moisture during storage or transit so that time constraints for commencement of a next processing step are removed through use of the silicon oxide plates 19. The processing steps of the present disclosure are compat-ible with general back-end-of-line (BEOL) processing steps. Further, reduction of the step height results in reduction in the topographical variations in the top surface of the upper via-level dielectric material layer 646, and the upper-level dielectric material layer 646 may be formed void-free. A planarization process for planarizing the top surface of the upper via-level dielectric material layer 646 prior to forma-tion of via cavities therethrough may not be necessary. Thus, the various embodiments of the present disclosure provides scaling of memory cells 20 for resistive memory devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an etch-stop dielectric layer overlying a substrate and comprising a first opening therethrough;
a silicon oxide plate overlying the etch-stop dielectric layer and comprising a second opening therethrough;
a first conductive structure comprising a first electrode and extending through the second opening and the first opening, wherein the first conductive structure com-prises a sidewall that is vertically coincident with an outer periphery of the silicon oxide plate;
a memory film contacting a top surface of the first conductive structure and comprising a material that provides at least two resistive states having different electrical resistivity; and
a second conductive structure comprising a second elec-trode and contacting a top surface of the memory film.

2. The semiconductor structure of claim 1, wherein a periphery of the second opening is laterally offset outward from a periphery of the first opening.

3. The semiconductor structure of claim 1, wherein the etch-stop dielectric layer comprises:
a horizontally-extending portion having a uniform thick-ness throughout and located outside an area of the first conductive structure;
a pedestal portion having an outer sidewall, wherein a bottom periphery of the outer sidewall of the pedestal portion is adjoined to a periphery of a top surface of the horizontally-extending portion; and wherein the silicon oxide plate is located on a top surface of the pedestal portion of the etch-stop dielectric layer.

4. The semiconductor structure of claim 3, wherein:
the silicon oxide plate comprises a tapered inner sidewall and a straight outer sidewall; and
the straight outer sidewall of the silicon oxide plate is vertically coincident with the outer sidewall of the pedestal portion.

5. The semiconductor structure of claim 3, wherein an annular tapered sidewall of the etch-stop dielectric layer comprises:
a top periphery that is adjoined to an annular top surface of the pedestal portion of the etch-stop dielectric layer; and
a bottom periphery located at, or below, a horizontal plane including a bottom surface of the horizontally-extend-ing portion of the etch-stop dielectric layer.

6. The semiconductor structure of claim 1, wherein the silicon oxide plate has a shape of an annular plate having a uniform vertical thickness in an outer portion adjoined to an outer sidewall and having a variable vertical thickness at a tapered inner sidewall that defines the second opening.

7. The semiconductor structure of claim 1, wherein a bottom periphery of the second opening is laterally offset from a bottom periphery of the first opening by a lateral offset distance that is greater than a thickness of the silicon oxide plate.

8. The semiconductor structure of claim 1, wherein the first conductive structure comprises a bottom metallic barrier contacting a bottom surface of the first electrode, and contacting a planar top surface of the silicon oxide plate, contacting a tapered inner sidewall of the second opening of the silicon oxide plate, and contacting a tapered inner sidewall of the first opening of the etch-stop dielectric layer.

9. The semiconductor structure of claim 1, wherein the second conductive structure comprises a metallic capping plate contacting a bottom surface of the second electrode and contacting a top surface of the memory film.

10. The semiconductor structure of claim 9, further comprising a dielectric spacer laterally surrounding, and contacting sidewalls of, a hard mask cap, the metallic capping plate, and the second electrode, and contacting an annular top surface segment of the memory film.

11. The semiconductor structure of claim 9, wherein a sidewall of the memory film is vertically coincident with a sidewall of the second electrode, a sidewall of the metallic capping plate, and a sidewall of a hard mask cap.

12. The semiconductor structure of claim 1, wherein the silicon oxide plate comprises a silicon oxide material including decomposition products of tetraethyl orthosilicate (TEOS) and contains: carbon atoms at an atomic concentration of at least 100 parts per million; and hydrogen atoms at an atomic concentration of at least 100 parts per million.

13. A semiconductor structure comprising:
an etch-stop dielectric layer overlying a substrate and comprising a two-dimensional array of first opening therethrough;
a two-dimensional array of silicon oxide plates overlying the etch-stop dielectric layer and comprising a respective second opening therethrough, wherein each of the second openings is laterally offset outward from a respective underlying first opening in the etch-stop dielectric layer; and
a two-dimensional array of memory cells located over the two-dimensional array of silicon oxide plates, wherein:
each of the memory cells comprises a first conductive structure, a memory film contacting a top surface of the first conductive structure, and a second conductive structure contacting a top surface of the memory film;
each of the first conductive structures comprises a respective first electrode and extends through a respective second opening and a respective first opening;
each of the memory films comprises a material that provides at least two resistive states having different electrical resistivity; and
each of the second conductive structures comprises a respective second electrode.

14. The semiconductor structure of claim 13, further comprising:
a two-dimensional array of access transistors located on the substrate, wherein each access transistor within the two-dimensional array of access transistors is electrically connected to a respective memory cell within the two-dimensional array of memory cells; and
metal interconnect structures located within dielectric material layers and providing electrical connection between the two-dimensional array of access transistors and the two-dimensional array of memory cells.

15. The semiconductor structure of claim 14, wherein:
the metal interconnect structures comprises a two-dimensional array of via structures; and the etch-stop dielectric layer contacts top surfaces of the via structures within the two-dimensional array of via structures and contacts a top surface of a topmost dielectric material layer within the dielectric material layers, and comprises a horizontally-extending portion and a two-dimensional array of pedestal portions.

16. A method of forming a semiconductor structure, comprising:
forming an etch-stop dielectric layer overlying a substrate;
forming a silicon oxide layer over the etch-stop dielectric layer;
forming an opening through the silicon oxide layer and the etch-stop dielectric layer,
forming a layer stack comprising a first electrode layer, a memory material layer, and a second electrode layer over the opening and over the silicon oxide layer; and
patterning the layer stack and the silicon oxide layer by performing at least one anisotropic etch process, whereby a patterned material stack including a first electrode, a memory film, and a second electrode is formed over a silicon oxide plate, wherein:
the silicon oxide plate comprises a patterned portion of the silicon oxide layer;
the first electrode comprises a patterned portion of the first electrode layer;
the memory film comprises a patterned portion of the memory material layer; and
the second electrode comprises a patterned portion of the second electrode layer.

17. The method of claim 16, further comprising:
forming dielectric material layers over the substrate; and
forming a bottom connection via structure comprising a metallic material in a topmost dielectric material layer selected from the dielectric material layers, wherein a top surface of the bottom connection via structure is physically exposed after formation of the opening through the silicon oxide layer and the etch-stop dielectric layer.

18. The method of claim 17, wherein:
the layer stack comprises a bottom metallic barrier layer that is deposited directly on the top surface of the bottom connection via structure;
the second electrode layer is formed on a top surface of the bottom metallic barrier layer; and
the patterned material stack comprise a bottom metallic barrier plate that is a patterned portion of the bottom metallic barrier layer.

19. The method of claim 16, further comprising:
forming a photoresist layer over the silicon oxide layer;
forming an opening in the photoresist layer; and
performing at least one etch process that transfers a pattern of the opening in the photoresist layer through the silicon oxide layer and the etch-stop dielectric layer, wherein the at least one etch process comprises an etch step having an isotropic etch chemistry or an isotropic etch component that laterally recesses a material of the silicon oxide layer.

20. The method of claim 16, wherein:
the layer stack comprises a hard mask layer that is formed above the second electrode layer;
the method further comprises:
patterning the hard mask layer into a hard mask cap;
forming a dielectric spacer around the hard mask cap and the second electrode after patterning the second electrode layer and prior to patterning the memory material layer; and performing an anisotropic etch process that patterns the memory material layer and the first electrode layer using a combination of the hard mask cap and the dielectric spacer as an etch mask.

* * * * *